US012787289B2

(12) United States Patent
Hosomura et al.

(10) Patent No.: US 12,787,289 B2

(45) Date of Patent: Nov. 3, 2026

(54) SEMICONDUCTOR MEMORY DEVICE AND SEMICONDUCTOR DEVICE

(71) Applicant: KIOXIA CORPORATION, Tokyo (JP)

(72) Inventors: Yoshikazu Hosomura, Kamakura (JP); Go Oike, Kuwana (JP); Yutaka Shimizu, Yokohama (JP); Masaki Nakamura, Fujisawa (JP); Hironobu Hamanaka, Yokkaichi (JP); Hideo Wada, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 407 days.

(21) Appl. No.: 18/604,848

(22) Filed: Mar. 14, 2024

(65) Prior Publication Data

US 2024/0324220 A1 Sep. 26, 2024

(30) Foreign Application Priority Data

Mar. 22, 2023 (JP) ................................ 2023-045012

(51) Int. Cl.

*H10B 43/27* (2023.01)
*H10B 80/00* (2026.01)
*H10W 90/00* (2026.01)

(52) U.S. Cl.

CPC ............. *H10B 43/27* (2023.02); *H10B 80/00* (2023.02); *H10W 90/00* (2026.01); *H10W 90/792* (2026.01)

(58) Field of Classification Search

CPC ....... H10B 43/27; H10B 80/00; H10W 90/00; H10W 90/792

See application file for complete search history.

(56) References Cited

U.S. PATENT DOCUMENTS

| | | | | |
|---|---|---|---|---|
| 11,570,886 B1 * | 1/2023 | Chang | .................. | H05K 1/0245 |
| 2013/0026599 A1 * | 1/2013 | Nakamura | .......... | H10W 20/023 257/508 |
| 2020/0266146 A1 * | 8/2020 | Nishida | .................. | H10B 43/10 |

(Continued)

FOREIGN PATENT DOCUMENTS

| | | |
|---|---|---|
| JP | 2022046249 A | 3/2022 |

OTHER PUBLICATIONS

Kiichi Tachi, "Semiconductor Device and Method for Manufacturing the Same", U.S. Appl. No. 18/176,557, filed Mar. 1, 2023, 52 pages.

*Primary Examiner* — Benjamin Tzu-Hung Liu

(74) *Attorney, Agent, or Firm* — Maier & Maier, PLLC

(57) ABSTRACT

A semiconductor memory device comprises: a substrate; a first wiring layer; a second wiring layer provided between the substrate and the first wiring layer; and a memory cell array layer provided between the substrate and the second wiring layer. The memory cell array layer comprises a contact extending in a first direction intersecting with a surface of the substrate. The first wiring layer has a second conductive layer that includes a connecting portion, a pad electrode portion, and a peripheral edge portion. The connecting portion is connected to one end in the first direction of the contact. The second wiring layer has: a first opening which is provided in a region including the connecting portion and the pad electrode portion of the second conductive layer; and a ring-shaped first slit which surrounds the peripheral edge portion of the second conductive layer.

20 Claims, 30 Drawing Sheets

(56) References Cited

U.S. PATENT DOCUMENTS

| | | | | |
|---|---|---|---|---|
| 2021/0035965 | A1* | 2/2021 | Mizutani | H10B 41/27 |
| 2022/0069093 | A1 | 3/2022 | Tagami et al. | |
| 2022/0077088 | A1 | 3/2022 | Okada et al. | |
| 2022/0238432 | A1 | 7/2022 | Matsumoto | |
| 2022/0285391 | A1 | 9/2022 | Yamabe et al. | |

* cited by examiner

SEMICONDUCTOR MEMORY DEVICE AND SEMICONDUCTOR DEVICE

CROSS-REFERENCE TO RELATED APPLICATIONS

This application is based upon and claims the benefit of Japanese Patent Application No. 2023-045012, filed on Mar. 22, 2023, the entire contents of which are incorporated herein by reference.

BACKGROUND

Field

Present embodiments relate to a semiconductor memory device and a semiconductor device.

Description of the Related Art

There is known a semiconductor memory device comprising: a substrate; a plurality of conductive layers arranged in a first direction intersecting with a surface of the substrate; a semiconductor layer extending in the first direction and opposed to the plurality of conductive layers; and an electric charge accumulating layer provided between the plurality of conductive layers and the semiconductor layer.

DETAILED DESCRIPTION

Figure 1:
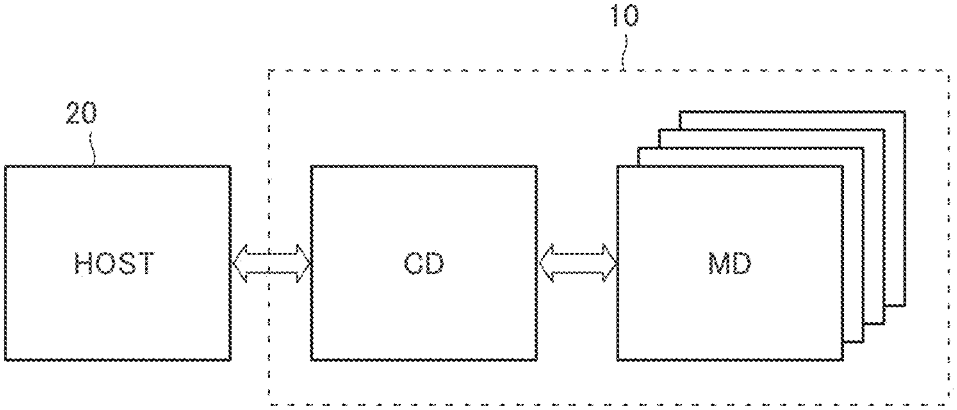
FIG. 1 is a schematic block diagram showing a configuration of a semiconductor memory device according to a first embodiment.

A semiconductor memory device according to one embodiment comprises: a substrate; a first wiring layer; a second wiring layer provided between the substrate and the first wiring layer; and a memory cell array layer provided between the substrate and the second wiring layer. The memory cell array layer comprises: a plurality of first conductive layers arranged in a first direction intersecting with a surface of the substrate; a semiconductor layer extending in the first direction and opposed to the plurality of first conductive layers; an electric charge accumulating layer provided between the plurality of first conductive layers and the semiconductor layer; and a contact extending in the first direction. The first wiring layer has a second conductive layer that includes a connecting portion, a pad electrode portion, and a peripheral edge portion. The connecting portion is connected to one end in the first direction of the contact. The second wiring layer has: a first opening which is provided in a region including the connecting portion and the pad electrode portion of the second conductive layer; and a ring-shaped first slit which surrounds the peripheral edge portion of the second conductive layer.

Moreover, a semiconductor device according to one embodiment comprises: a substrate; a first wiring layer; a second wiring layer provided between the substrate and the first wiring layer; and a contact extending in a first direction intersecting with a surface of the substrate. The first wiring layer has a first conductive layer that includes a connecting portion, a pad electrode portion, and a peripheral edge portion. The connecting portion is connected to one end in the first direction of the contact. The second wiring layer has: a first opening which is provided in a region including the connecting portion and the pad electrode portion of the first conductive layer; and a ring-shaped first slit which surrounds the peripheral edge portion of the first conductive layer.

Next, semiconductor memory devices according to embodiments will be described in detail with reference to the drawings. Note that the following embodiments are merely examples, and are not shown with the intention of limiting the present invention.

Moreover, when a "semiconductor memory device" is referred to in the present specification, it will sometimes mean a memory die (a memory chip), and will sometimes mean a memory system including a controller die, of the likes of a memory card, or an SSD. Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, in the case of three transistors having been serially connected, the first transistor is still "electrically connected" to the third transistor even when the second transistor is in an OFF state.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, when a circuit, or the like, is said to "make electrically conductive" two wirings, or the like, this will sometimes mean, for example, that this circuit, or the like, includes a transistor, or the like, that this transistor, or the like, is provided in a current path between the two wirings, and that this transistor, or the like, is in an ON state.

Moreover, in the present specification, a certain direction parallel to an upper surface of a substrate will be referred to as an X-direction, a direction parallel to the upper surface of the substrate and perpendicular to the X-direction will be referred to as a Y-direction, and a direction perpendicular to the upper surface of the substrate will be referred to as a Z-direction.

Moreover, in the present specification, a direction lying along a certain plane will sometimes be referred to as a first direction, a direction intersecting with the first direction along the certain plane will sometimes be referred to as a second direction, and a direction intersecting with the certain plane will sometimes be referred to as a third direction. These first direction, second direction, and third direction may correspond to any of the X-direction, the Y-direction, and the Z-direction, but need not do so.

Moreover, in the present specification, expressions such as "above" or "below" will be defined with reference to the substrate. For example, an orientation of moving away from the substrate along the above-described Z-direction will be referred to as above, and an orientation of coming closer to the substrate along the Z-direction will be referred to as below. Moreover, when a lower surface or a lower end is referred to for a certain configuration, this will be assumed to mean a surface or an end portion on a substrate side of this configuration, and when an upper surface or an upper end is referred to for a certain configuration, this will be assumed to mean a surface or an end portion on an opposite side to the substrate of this configuration. Moreover, a surface intersecting with the X-direction or the Y-direction will be referred to as a side surface, and so on.

Moreover, in the present specification, when the likes of a "width", a "length", or a "thickness" in a certain direction is referred to for a configuration, a member, and so on, this will sometimes mean a width, a length, or a thickness, and so on, in a cross section observed by the likes of SEM (Scanning Electron Microscopy) or TEM (Transmission Electron Microscopy), and so on.

First Embodiment

[Memory System 10]

FIG. 1 is a schematic block diagram showing a configuration of a memory system 10 according to a first embodiment.

The memory system 10 executes read, write, erase, and so on, of user data, in response to a signal transmitted from a host computer 20. The memory system 10 is a memory card, an SSD, or another system capable of storing user data, for example. The memory system 10 comprises: a plurality of memory dies MD storing user data; and a controller die CD connected to these plurality of memory dies MD and to the host computer 20. The controller die CD comprises the likes of a processor and a RAM, for example, and executes processing, such as conversion of a logical address and a physical address, bit error detection/correction, garbage collection (compaction), and wear leveling.

Figure 2:
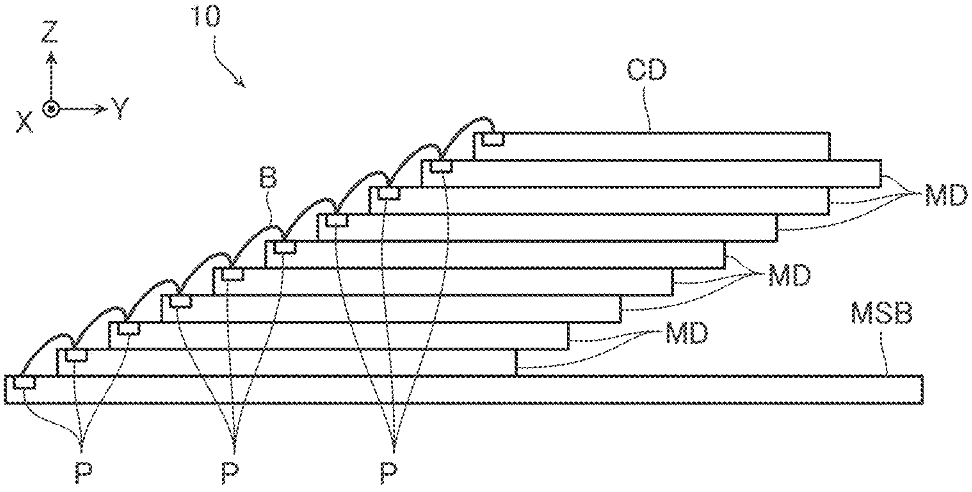
FIG. 2 is a schematic side view showing an exemplary configuration of the same semiconductor memory device.
Figure 3:
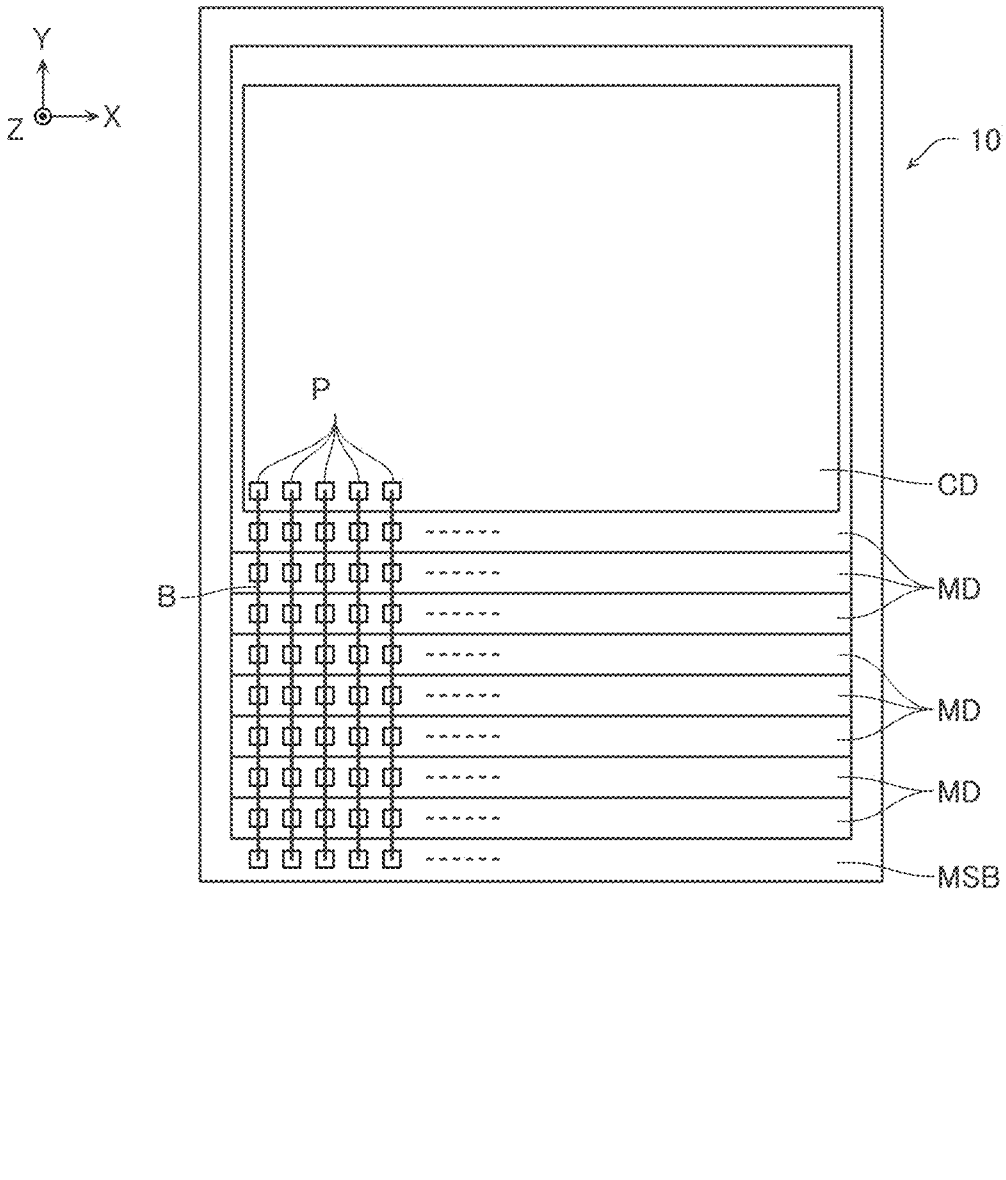
FIG. 3 is a schematic plan view showing an exemplary configuration of the same semiconductor memory device.

FIG. 2 is a schematic side view showing an exemplary configuration of the memory system 10 according to the present embodiment. FIG. 3 is a schematic plan view showing the same exemplary configuration. For convenience of description, some configurations are omitted in FIG. 2 and FIG. 3.

As shown in FIG. 2, the memory system 10 according to the present embodiment comprises: a mounting substrate MSB; the plurality of memory dies MD stacked on the mounting substrate MSB; and the controller die CD stacked on the memory die MD. A region of an end portion in the Y-direction, of an upper surface of the mounting substrate MSB is provided with pad electrodes P, and a part of another region of the upper surface of the mounting substrate MSB is adhered to a lower surface of the memory die MD, via an adhesive agent, or the like. A region of an end portion in the Y-direction, of an upper surface of the memory die MD is provided with pad electrodes P, and another region of the upper surface of the memory die MD is adhered to a lower surface of another memory die MD or of the controller die CD, via an adhesive agent, or the like. A region of an end portion in the Y-direction, of an upper surface of the controller die CD is provided with pad electrodes P.

As shown in FIG. 3, the mounting substrate MSB, the plurality of memory dies MD, and the controller die CD each comprise a plurality of pad electrodes P arranged in the X-direction. Pluralities of pad electrodes P provided to the mounting substrate MSB, the plurality of memory dies MD, and the controller die CD are respectively connected to each other via bonding wires B.

Note that the configuration shown in FIG. 2 and FIG. 3 is merely an exemplification, and that a specific configuration is appropriately adjustable. For example, in the example shown in FIG. 2 and FIG. 3, the controller die CD is stacked on the plurality of memory dies MD, and these configurations are connected by the bonding wires B. In such a configuration, the plurality of memory dies MD and the controller die CD are included in a single package.

However, the controller die CD may be included in a separate package from the memory dies MD. Moreover, the plurality of memory dies MD and the controller die CD may be connected to each other via through-electrodes, or the like, not the bonding wires B.

[Circuit Configuration of Memory Die MD]

Figure 4:
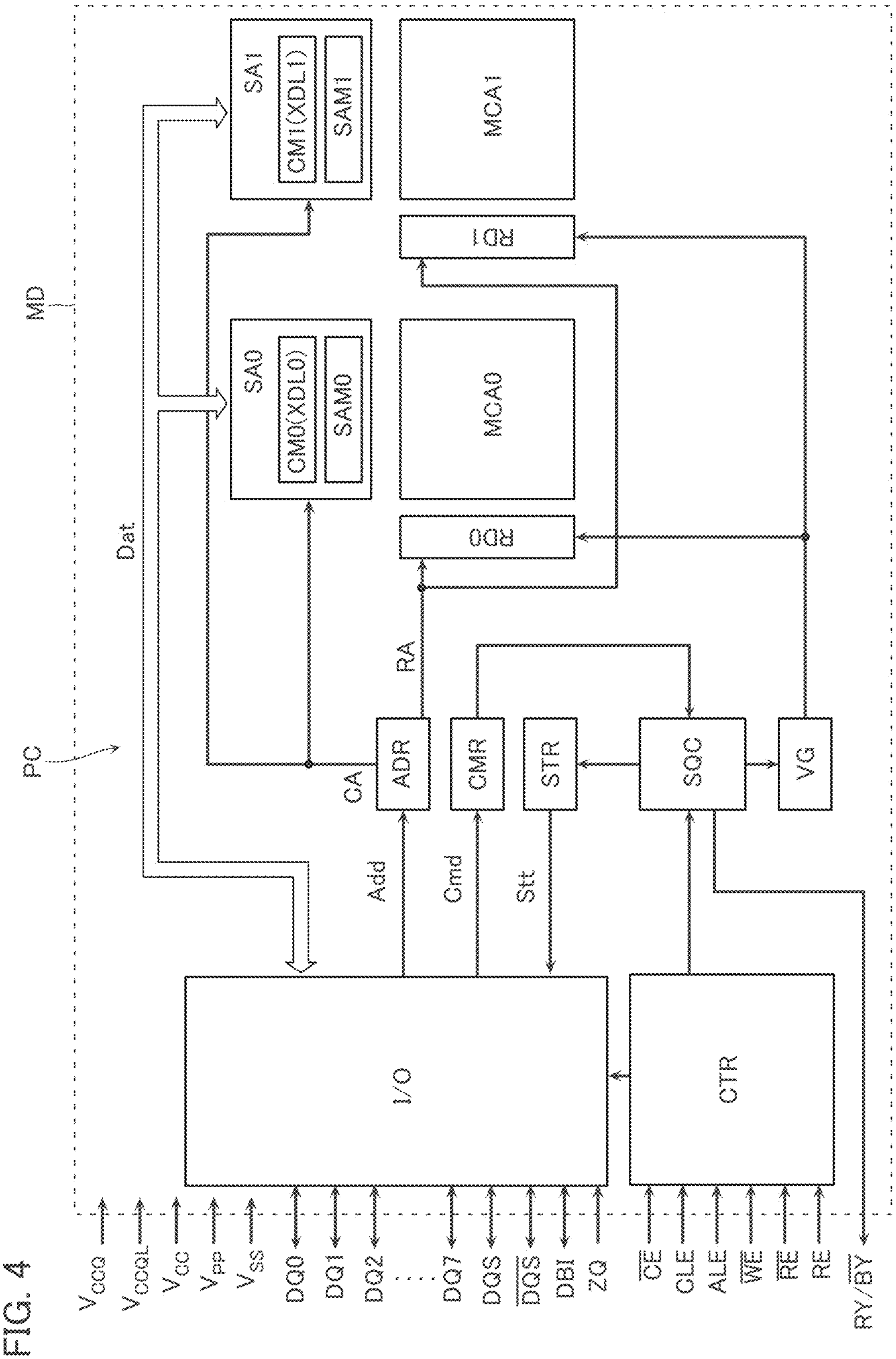
FIG. 4 is a schematic block diagram showing an exemplary configuration of the same semiconductor memory device.
Figure 5:
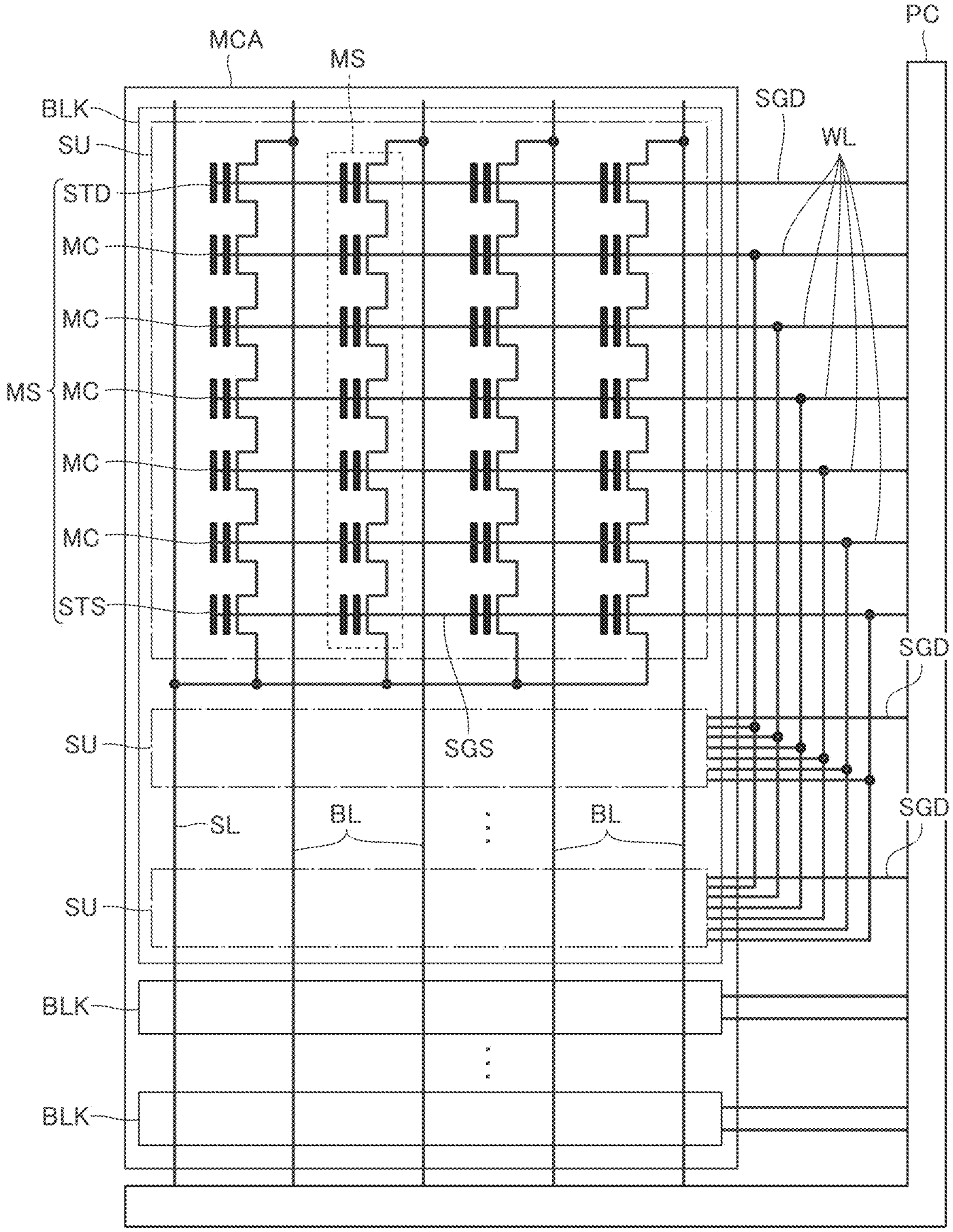
FIG. 5 is a schematic circuit diagram showing a part of a configuration of the same semiconductor memory device.
Figure 6:
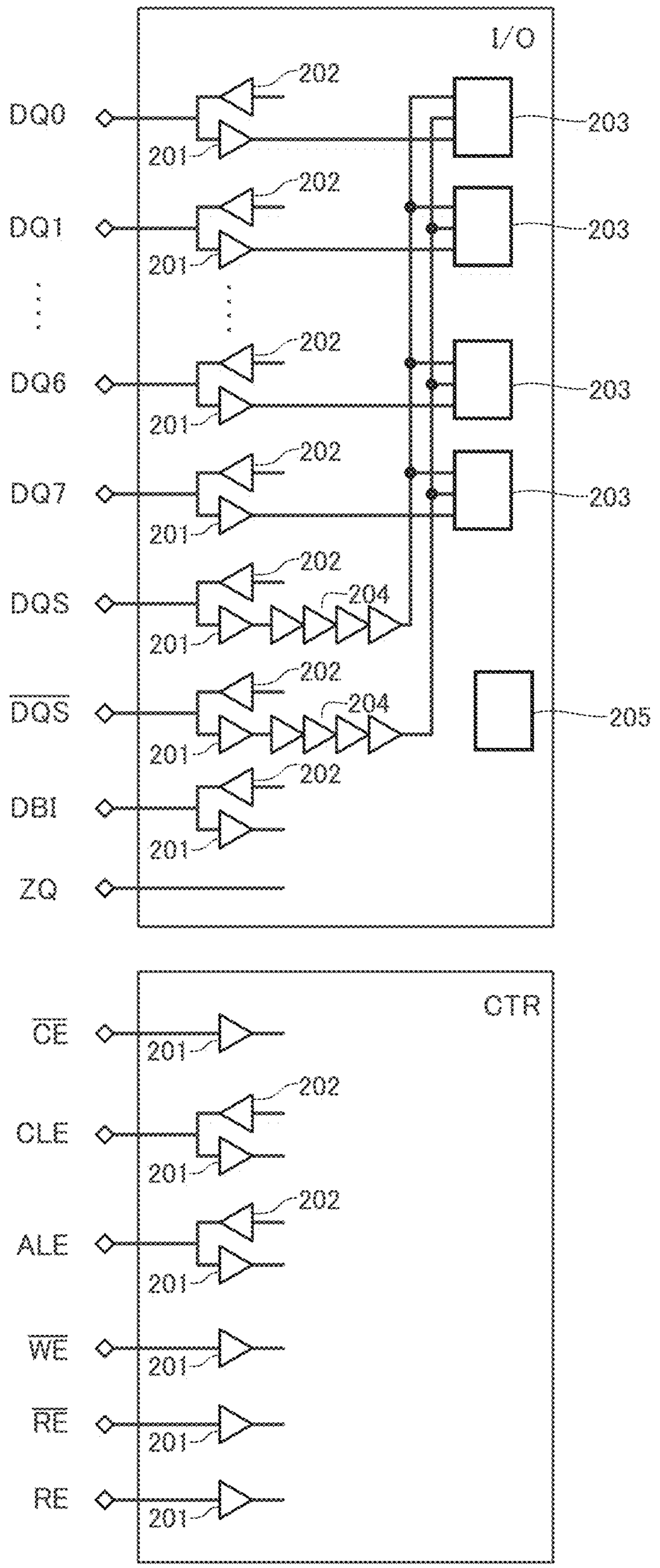
FIG. 6 is a schematic circuit diagram showing a part of the configuration of the same semiconductor memory device.

FIG. 4 is a schematic block diagram showing a configuration of the memory die MD according to the first embodiment. FIG. 5 is a schematic circuit diagram showing a part of a configuration of the memory die MD. FIG. 6 is a schematic circuit diagram showing a part of a configuration of an input/output control circuit I/O and a logic circuit CTR that will be mentioned later. For convenience of description, some configurations are omitted in FIG. 4 to FIG. 6.

Note that in FIG. 4, a plurality of control terminals, and so on, are illustrated. These plurality of control terminals are sometimes indicated as a control terminal corresponding to a high active signal (a positive logic signal), sometimes indicated as a control terminal corresponding to a low active signal (a negative logic signal), and sometimes indicated as a control terminal corresponding to both a high active signal and a low active signal. In FIG. 4, a symbol of a control terminal corresponding to a low active signal includes an overline (an overbar). In the present specification, a symbol of a control terminal corresponding to a low active signal includes a slash ("/"). Note that description of FIG. 4 is an exemplification, and that a specific mode is appropriately adjustable. For example, it is possible too for some or all of the high active signals to be configured as low active signals, or for a part of or all of the low active signals to be configured as high active signals.

As shown in FIG. 4, the memory die MD comprises: memory cell arrays MCA0, MCA1 that store user data; and a peripheral circuit PC which is connected to the memory cell arrays MCA0, MCA1. Note that in the description below, the memory cell arrays MCA0, MCA1 will sometimes be referred to as a memory cell array MCA.

[Circuit Configuration of Memory Cell Array MCA]

As shown in FIG. 5, the memory cell array MCA comprises a plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory cell transistors), and a source side select transistor STS that are connected in series between the bit line BL and the source line SL. Hereafter, the drain side select transistor STD and the source side select transistor STS will sometimes simply be referred to as select transistors (STD, STS).

The memory cell MC is a field effect type transistor comprising a semiconductor layer, a gate insulating film, and a gate electrode. The semiconductor layer functions as a channel region. The gate insulating film includes an electric charge accumulating film. A threshold voltage of the memory cell MC changes according to an amount of charge in the electric charge accumulating film. The memory cell MC usually stores one bit or a plurality of bits of user data. Note that the gate electrodes of the plurality of memory cells MC corresponding to one memory string MS are respectively connected with word lines WL. These word lines WL are respectively commonly connected to all of the memory strings MS in one memory block BLK.

The select transistors (STD, STS) are field effect type transistors each comprising a semiconductor layer, a gate insulating film, and a gate electrode. The semiconductor layer functions as a channel region. The gate electrodes of the select transistors (STD, STS) are respectively connected with a drain side select gate line SGD and a source side select gate line SGS. The drain side select gate line SGD is provided correspondingly to the string unit SU, and is commonly connected to all of the memory strings MS in one string unit SU. The source side select gate line SGS is commonly connected to all of the memory strings MS in the memory block BLK. Hereafter, the drain side select gate line SGD and the source side select gate line SGS will sometimes simply be referred to as select gate lines (SGD, SGS).

[Circuit Configuration of Peripheral Circuit PC]

As shown in FIG. 4, for example, the peripheral circuit PC comprises row decoders RD0, RD1 and sense amplifiers SA0, SA1 that are respectively connected to the memory cell arrays MCA0, MCA1. Moreover, the peripheral circuit PC comprises a voltage generating circuit VG and a sequencer SQC. Moreover, the peripheral circuit PC comprises the input/output control circuit I/O, the logic circuit CTR, an address register ADR, a command register CMR, and a status register STR. Note that in the description below, the row decoders RD0, RD1 will sometimes be referred to as a row decoder RD, and the sense amplifiers SA0, SA1 will sometimes be referred to as a sense amplifier SA.

[Configuration of Row Decoder RD]

The row decoder RD comprises a decode circuit and a switch circuit, for example. The decode circuit decodes a row address RA held in the address register ADR. The switch circuit causes the word line WL and select gate lines (SGD, SGS) corresponding to the row address RA to be electrically conductive with their corresponding voltage supply lines, in response to an output signal of the decode circuit.

[Configuration of Sense Amplifier SA]

The sense amplifiers SA0, SA1 (FIG. 4) respectively comprise sense amplifier modules SAM0, SAM1 and cache memories CM0, CM1 (data registers). The cache memories CM0, CM1 respectively comprise latch circuits XDL0, XDL1.

Note that in the description below, the sense amplifier modules SAM0, SAM1 will sometimes be referred to as a sense amplifier module SAM, the cache memories CM0, CM1 will sometimes be referred to as a cache memory CM, and the latch circuits XDL0, XDL1 will sometimes be referred to as a latch circuit XDL.

A plurality of the latch circuits XDL are respectively connected to latch circuits within the sense amplifier module SAM. The latch circuit XDL stores user data to be written to the memory cell MC or user data that has been read from the memory cell MC, for example.

The cache memory CM is connected with a column decoder, for example. The column decoder decodes a column address CA stored in the address register ADR (FIG. 4), and selects the latch circuit XDL corresponding to the column address CA.

Note that user data Dat included in these plurality of latch circuits XDL is sequentially transferred to the latch circuits within the sense amplifier module SAM during a write operation. Moreover, user data Dat included in the latch circuits within the sense amplifier module SAM is sequentially transferred to the latch circuits XDL during a read operation. Moreover, user data Dat included in the latch circuits XDL is sequentially transferred to the input/output control circuit I/O during a data-out operation.

[Configuration of Voltage Generating Circuit VG]

The voltage generating circuit VG (FIG. 4) includes a step-down circuit such as a regulator, and a booster circuit such as a charge pump circuit, for example. These step-down circuit and booster circuit are each connected to voltage supply lines applied with a power supply voltage $V_{CC}$ and a ground voltage $V_{SS}$ (FIG. 4). These voltage supply lines are connected to the pad electrodes P described with reference to FIG. 2 and FIG. 3, for example. The voltage generating circuit VG generates and simultaneously outputs to the plurality of voltage supply lines a plurality of types of operation voltages that are applied to the bit lines BL, the source line SL, the word lines WL, and the select gate lines (SGD, SGS) during a read operation, a write operation, and an erase operation on the memory cell array MCA, according to a control signal from the sequencer SQC, for example. The operation voltages outputted from the voltage supply lines are appropriately adjusted according to the control signal from the sequencer SQC.

[Configuration of Sequencer SQC]

The sequencer SQC (FIG. 4) outputs an internal control signal to the row decoders RD0, RD1, the sense amplifier modules SAM0, SAM1, and the voltage generating circuit VG, in accordance with command data Cmd stored in the command register CMR. In addition, the sequencer SQC appropriately outputs to the status register STR status data Stt indicating a state of the memory die MD.

Moreover, the sequencer SQC generates a ready/busy signal, and outputs the ready/busy signal to a terminal RY//BY. In a period when the terminal RY//BY is in an "L" state (a busy period), access to the memory die MD is basically prohibited. Moreover, in a period when the terminal RY//BY is in an "H" state (a ready period), access to the memory die MD is allowed. Note that the terminal RY//BY is realized by the pad electrode P described with reference to FIG. 2 and FIG. 3, for example.

[Configuration of Address Register ADR]

As shown in FIG. 4, the address register ADR is connected to the input/output control circuit I/O and stores address data Add that has been inputted from the input/output control circuit I/O. The address register ADR comprises a plurality of 8-bit register columns, for example. The register column latches address data Add corresponding to an under-execution internal operation such as a read operation, a write operation, or an erase operation, when the internal operation is executed, for example.

Note that the address data Add includes the column address CA (FIG. 4) and the row address RA (FIG. 4), for example. The row address RA includes, for example: a block address specifying the memory block BLK (FIG. 5); a page address specifying the string unit SU and the word line WL; a plane address specifying the memory cell array MCA (plane); and a chip address specifying the memory die MD.

[Configuration of Command Register CMR]

The command register CMR is connected to the input/output control circuit I/O and stores command data Cmd that has been inputted from the input/output control circuit I/O. The command register CMR comprises at least one set of 8-bit register columns, for example. When command data Cmd is stored in the command register CMR, a control signal is transmitted to the sequencer SQC.

[Configuration of Status Register STR]

The status register STR is connected to the input/output control circuit I/O and stores status data Stt to be outputted to the input/output control circuit I/O. The status register STR comprises a plurality of 8-bit register columns, for example. The register column latches status data Stt relating to an under-execution internal operation such as a read operation, a write operation, or an erase operation, when the internal operation is executed, for example. Moreover, the register column latches ready/busy information of the memory cell arrays MCA0, MCA1, for example.

[Configuration of Input/Output Control Circuit I/O]

As shown in FIG. 6, for example, the input/output control circuit I/O (FIG. 4) comprises input circuits 201 and output circuits 202 connected to each of data signal input/output terminals DQ0 to DQ7, data strobe signal input/output terminals DQS, /DQS, and a data bus inversion signal input/output terminal DBI. The input circuit 201 is a receiver such as a comparator, for example. The output circuit 202 is a driver such as an OCD (Off Chip Driver) circuit, for example. Moreover, the input/output control circuit I/O comprises a ZQ (output impedance) calibration-purposed terminal ZQ.

In addition, the input/output control circuit I/O (FIG. 4) comprises a plurality of latch circuits 203 provided correspondingly to each of the data signal input/output terminals DQ0 to DQ7. These plurality of latch circuits 203 are connected to output terminals of the input circuits 201 connected to corresponding data signal input/output terminals DQ0 to DQ7. Moreover, as mentioned above, these plurality of latch circuits 203 latch "H" or "L" according to a voltage value of the output terminal of the input circuit 201, at a timing of switching of input signals of the data strobe signal input/output terminals DQS, /DQS.

In addition, the input/output control circuit I/O (FIG. 4) comprises signal transfer circuits 204 provided correspondingly to each of the data strobe signal input/output terminals DQS, /DQS. The signal transfer circuit 204 comprises an even number of serially connected CMOS inverters, for example. An input terminal of the signal transfer circuit 204 is connected to the output terminal of the input circuit 201. An output terminal of the signal transfer circuit 204 is connected to the latch circuit 203.

Moreover, the input/output control circuit I/O (FIG. 4) comprises an internal path delay detection circuit 205. The internal path delay detection circuit 205 detects a difference in amount of delay of signals between a transmission path of signals corresponding to the data signal input/output terminals DQ0 to DQ7 and a transmission path of signals corresponding to the data strobe signal input/output terminals DQS, /DQS.

[Configuration of Logic Circuit CTR]

The logic circuit CTR (FIG. 4) comprises: a plurality of external control terminals /CE, CLE, ALE, /WE, /RE, RE; and a logic circuit connected to the plurality of external control terminals /CE, CLE, ALE, /WE, /RE, RE. The logic circuit CTR receives an external control signal from the controller die CD via the external control terminals /CE, CLE, ALE, /WE, /RE, RE and outputs an internal control signal to the input/output control circuit I/O depending on this external control signal.

As shown in FIG. 6, for example, the logic circuit CTR comprises: the input circuits 201 connected to each of the external control terminals /CE, CLE, ALE, /WE, /RE, RE; and the output circuits 202 connected to each of the external control terminals CLE, ALE. Note that the external control terminals /CE, CLE, ALE, /WE, /RE, RE are each realized by the pad electrode P described with reference to FIG. 2 and FIG. 3, for example.

A signal that has been inputted via the external control terminal /CE (for example, a chip enable signal) is employed during selection of the memory die MD. For example, a memory die MD whose external control terminal /CE has been inputted with "L" will be in a state where input/output of command data Cmd and address data Add (hereafter, sometimes simply referred to as "data") thereto/therefrom is possible. Moreover, for example, a memory die MD whose external control terminal /CE has been inputted with "H" will be in a state where input/output of data thereto/therefrom is not possible.

A signal that has been inputted via the external control terminal CLE (for example, a command latch enable signal) is employed during use of the command register CMR, and so on.

A signal that has been inputted via the external control terminal ALE (for example, an address latch enable signal) is employed during use of the address register ADR, and so on.

A signal that has been inputted via the external control terminal /WE (for example, a write enable signal) is employed during input of data from the controller die CD to the memory die MD, and so on.

Signals that have been inputted via the external control terminals /RE, RE (for example, a read enable signal and complementary signal thereof) are employed during output of data via the data signal input/output terminals DQ0 to DQ7. Data to be outputted from the data signal input/output terminals DQ0 to DQ7 is switched at a timing of a falling edge of voltage (switching of input signal) of the external control terminal /RE and rising edge of voltage (switching of input signal) of the external control terminal RE and a timing of a rising edge of voltage (switching of input signal) of the external control terminal /RE and falling edge of voltage (switching of input signal) of the external control terminal RE.

[Structure of Memory Die MD]

Figure 7:
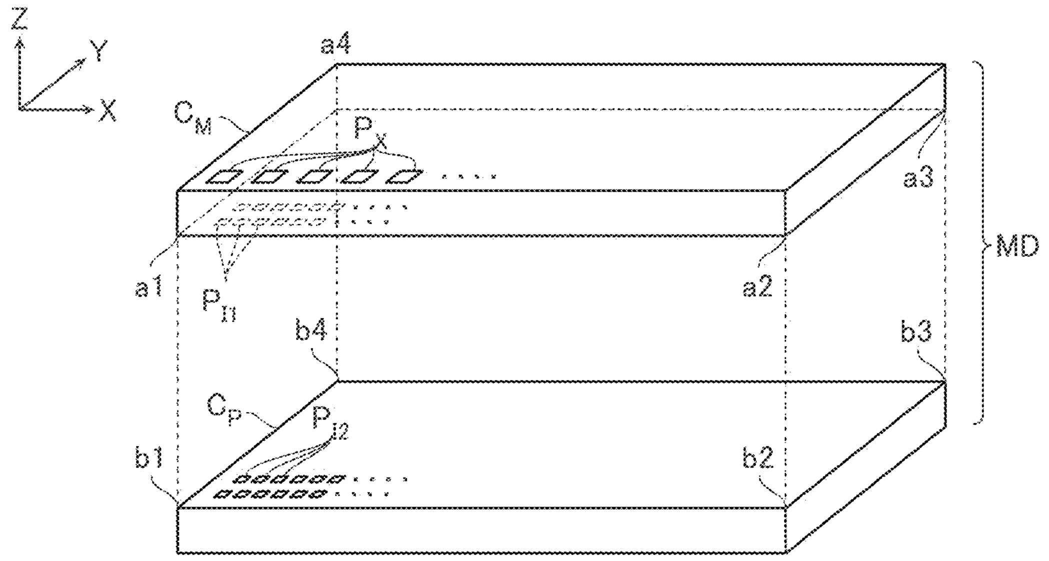
FIG. 7 is a schematic perspective view showing a part of the configuration of the same semiconductor memory device.

FIG. 7 is a schematic exploded perspective view showing an exemplary configuration of the semiconductor memory device according to the present embodiment. As shown in FIG. 7, the memory die MD comprises: a chip $C_M$ on a memory cell array side; and a chip $C_P$ on a peripheral circuit side.

An upper surface of the chip $C_M$ is provided with a plurality of external pad electrodes $P_X$. Moreover, a lower surface of the chip $C_M$ is provided with a plurality of first bonding electrodes $P_{I1}$. Moreover, an upper surface of the chip $C_P$ is provided with a plurality of second bonding electrodes $P_{I2}$. Hereafter, a surface provided with the plurality of first bonding electrodes $P_{I1}$, of the chip $C_M$ will be referred to as a front surface of the chip $C_M$, and a surface provided with the plurality of external pad electrodes $P_X$, of the chip $C_M$ will be referred to as a back surface of the chip $C_M$. Moreover, a surface provided with the plurality of second bonding electrodes $P_{I2}$, of the chip $C_P$ will be referred to as a front surface of the chip $C_P$, and a surface on an opposite side to the front surface, of the chip $C_P$ will be referred to as a back surface of the chip $C_P$. In the example illustrated, the front surface of the chip $C_P$ is provided above the back surface of the chip $C_P$, and the back surface of the chip $C_M$ is provided above the front surface of the chip $C_M$.

The chip $C_M$ and the chip $C_P$ are disposed in such a manner that the front surface of the chip $C_M$ and the front surface of the chip $C_P$ are opposed to each other. The plurality of first bonding electrodes $P_{I1}$ are provided respectively correspondingly to the plurality of second bonding electrodes $P_{I2}$, and are disposed at positions enabling them to be bonded to the plurality of second bonding electrodes $P_{I2}$. The first bonding electrodes $P_{I1}$ and the second bonding electrodes $P_{I2}$ function as bonding electrodes for bonding and making electrically conductive the chip $C_M$ and the chip $C_P$. The external pad electrodes $P_X$ function as the pad electrodes P described with reference to FIG. 2 and FIG. 3.

Note that in the example of FIG. 7, corners a1, a2, a3, a4 of the chip $C_M$ respectively correspond to corners b1, b2, b3, b4 of the chip $C_P$.

Figure 8:
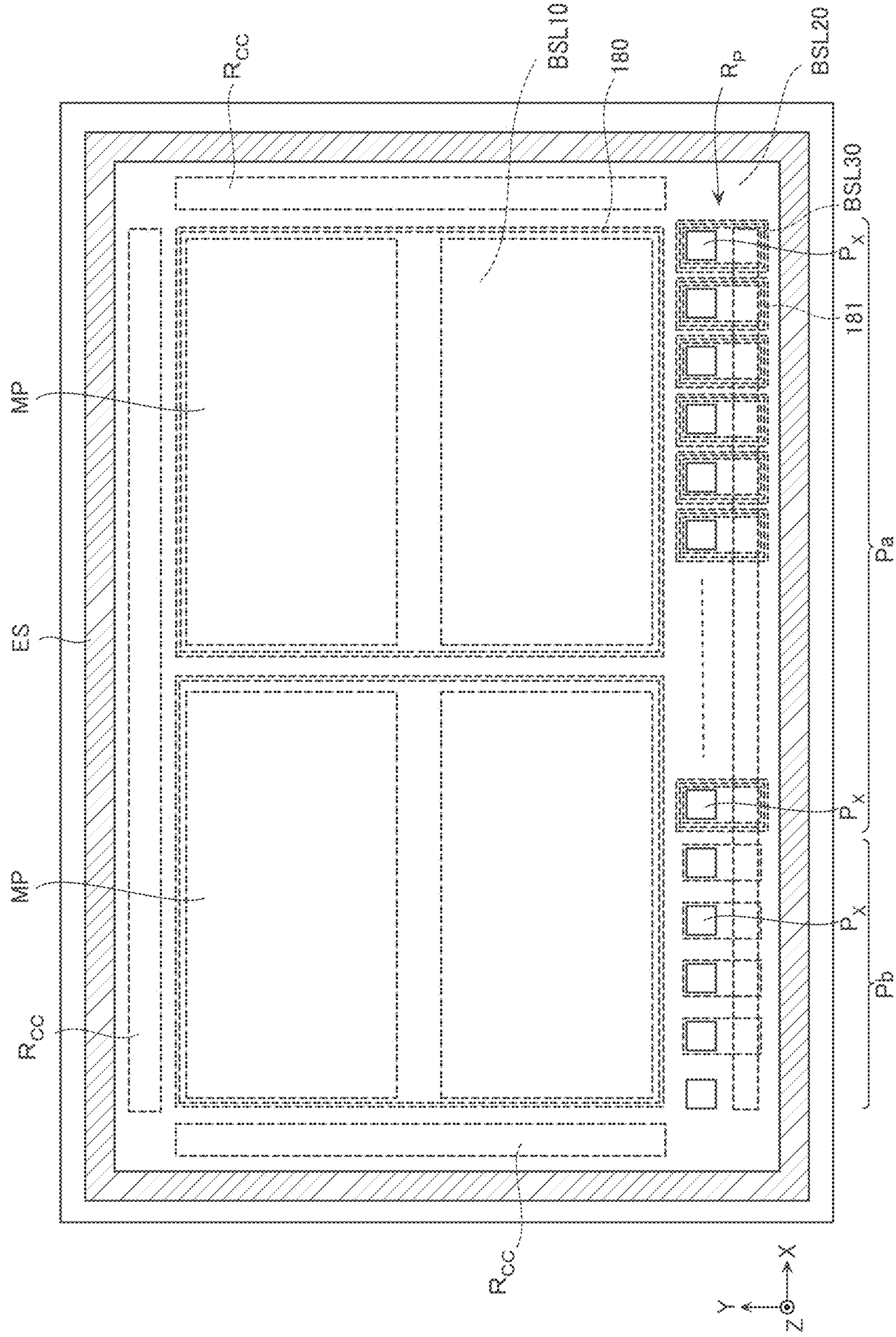
FIG. 8 is a schematic plan view showing a part of the configuration of the same semiconductor memory device.
Figure 9:
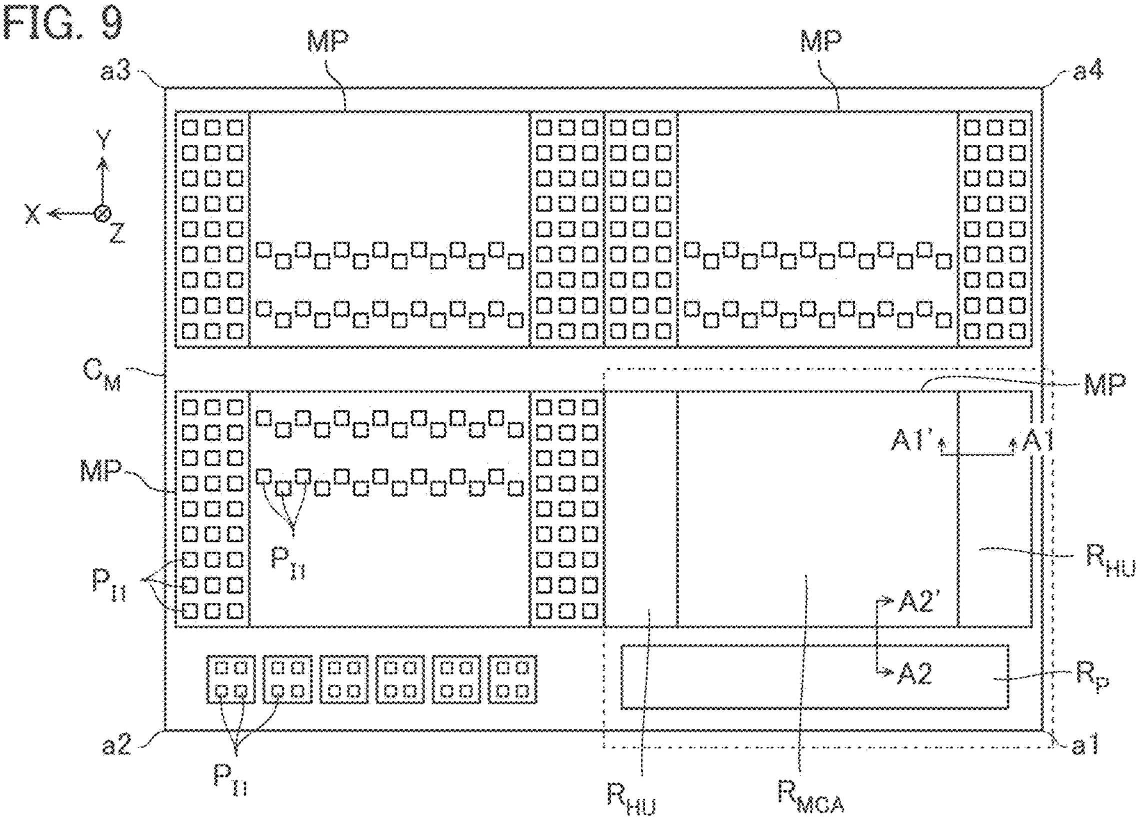
FIG. 9 is a schematic bottom view showing a part of the configuration of the same semiconductor memory device.
Figure 10:
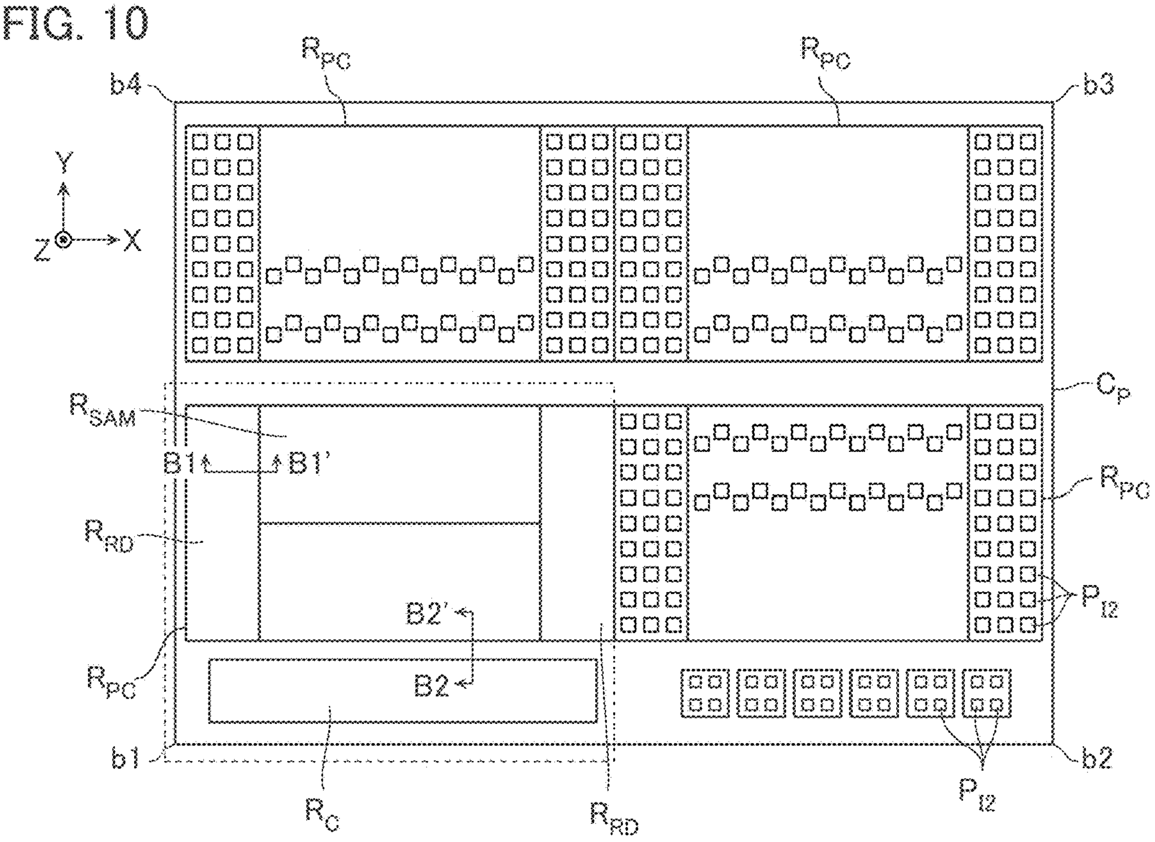
FIG. 10 is a schematic plan view showing a part of the configuration of the same semiconductor memory device.
Figure 11:
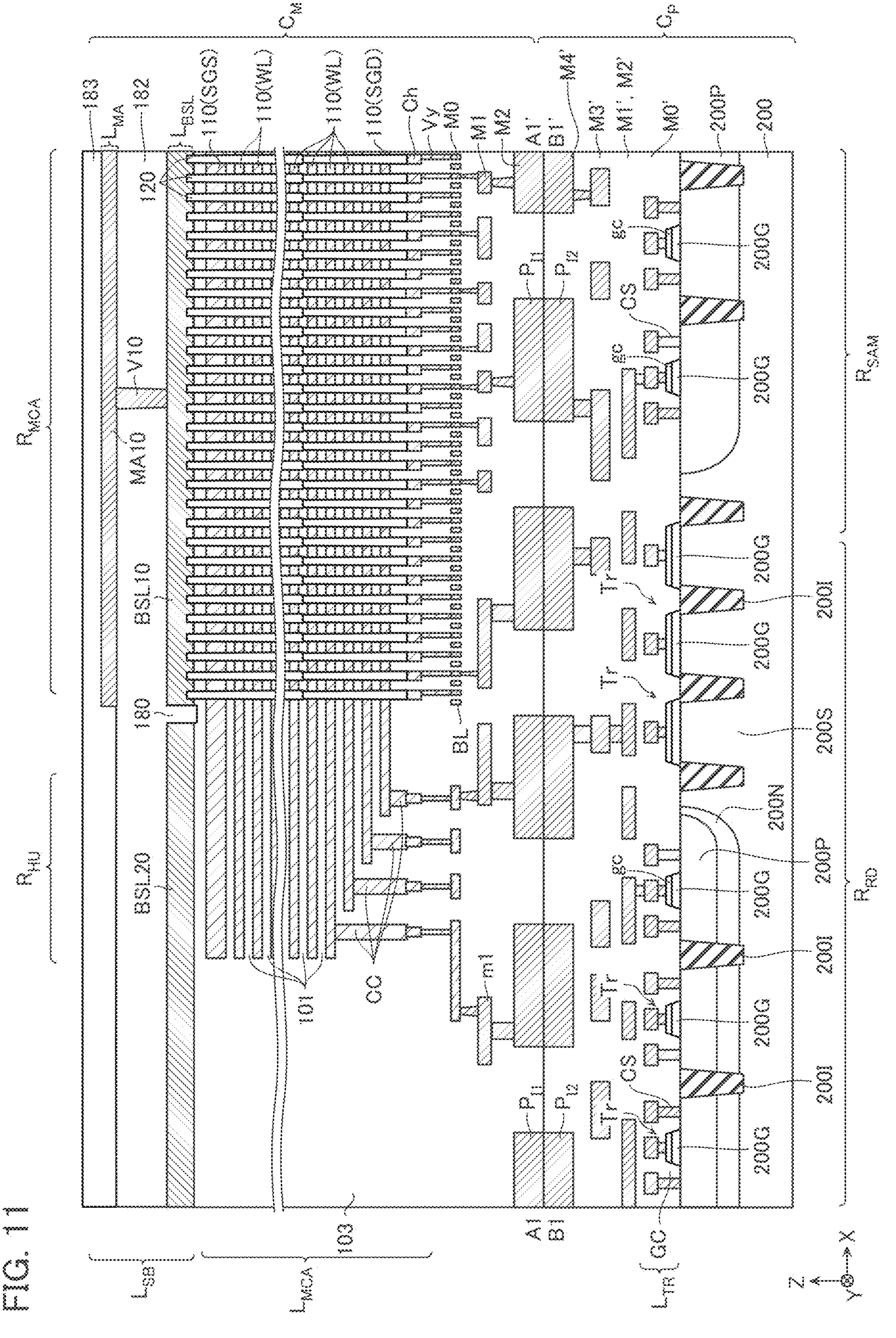
FIG. 11 is a schematic cross-sectional view corresponding to the line A1-A1' of FIG. 9 and the line B1-B1' of FIG. 10.
Figure 12:
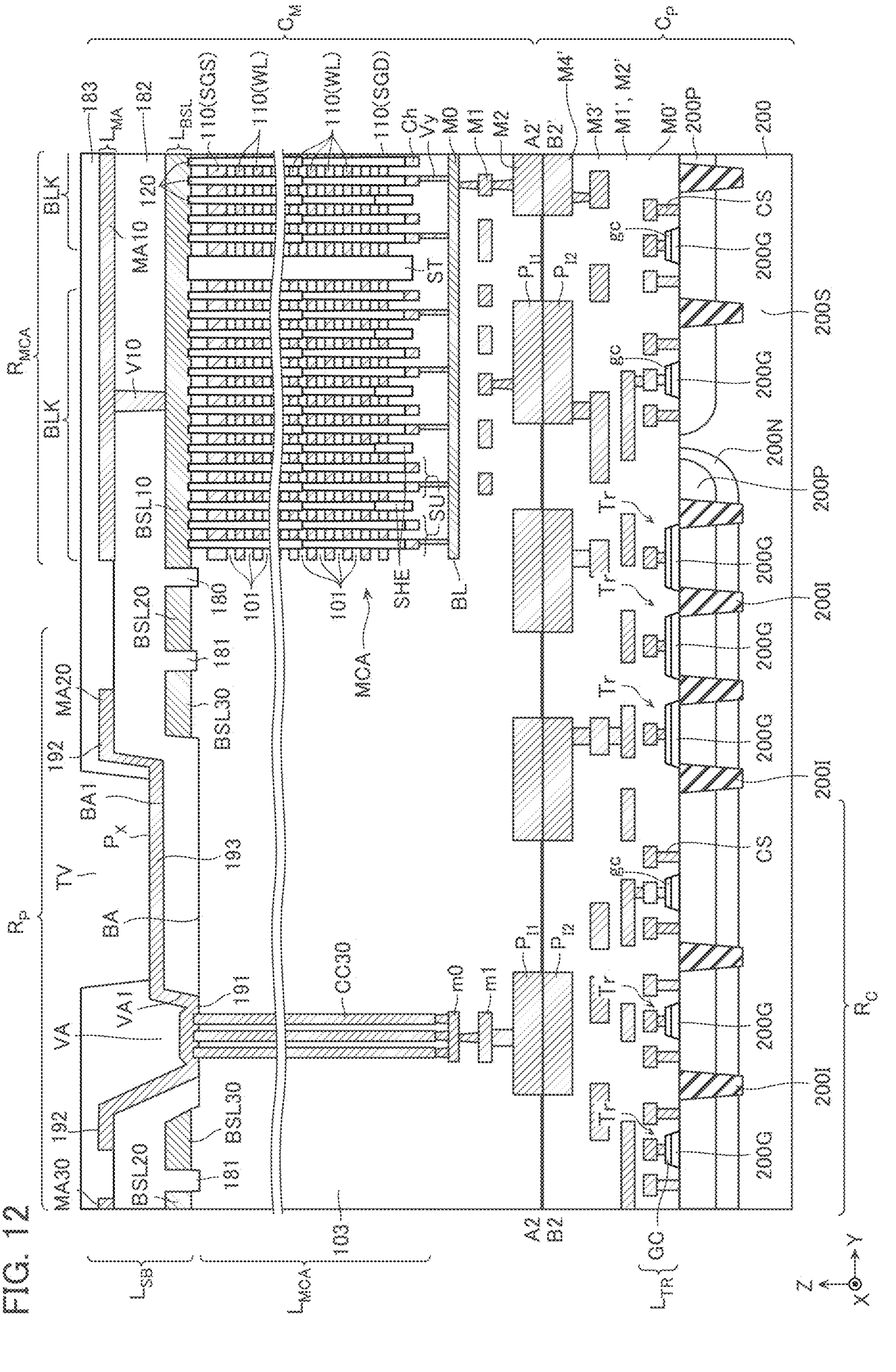
FIG. 12 is a schematic cross-sectional view corresponding to the line A2-A2' of FIG. 9 and the line B2-B2' of FIG. 10.

FIG. 8 is a schematic plan view showing an exemplary configuration of the chip $C_M$. FIG. 9 is a schematic bottom view showing an exemplary configuration of the chip $C_M$. A portion surrounded by dotted lines at bottom right of FIG. 9 shows structure more to an inside than the chip $C_M$'s surface where the plurality of first bonding electrodes $P_{I1}$ are provided. FIG. 10 is a schematic plan view showing an exemplary configuration of the chip $C_P$. A portion surrounded by dotted lines at bottom left of FIG. 10 shows structure more to an inside than the chip $C_P$'s surface where the plurality of second bonding electrodes $P_{I2}$ are provided. FIG. 11 is a schematic cross-sectional view corresponding to the line A1-A1' of FIG. 9 and the line B1-B1' of FIG. 10. FIG. 12 is a schematic cross-sectional view corresponding to the line A2-A2' of FIG. 9 and the line B2-B2' of FIG. 10. FIG. 11 and FIG. 12 show cross sections in the case where structures shown in FIG. 9 and FIG. 10 have been cut along each of the lines and viewed in directions of the arrows.

[Structure of Chip $C_M$]

As shown in FIG. 8, for example, the chip $C_M$ comprises four memory planes MP arranged in the X-direction and the Y-direction. As shown in FIG. 9, the memory plane MP comprises: a memory cell array region $R_{MCA}$ where the memory cell array MCA is provided; and hook-up regions $R_{HU}$ provided on a side at one end in the X-direction and a side at the other end in the X-direction of the memory cell array region $R_{MCA}$. In addition, the chip $C_M$ comprises: a peripheral region $R_P$ provided adjacently to a side at one end in the Y-direction of the four memory planes MP; a CC wiring region $R_{CC}$ provided adjacently to a side at the other end in the Y-direction of the four memory planes MP; and CC wiring regions $R_{CC}$ respectively provided adjacently to both sides in the X-direction of the four memory planes MP. The memory planes MP, the peripheral region $R_P$, and the CC wiring regions $R_{CC}$ are surrounded by an edge seal ES formed along an outer periphery of the chip $C_M$.

As shown in FIG. 11 and FIG. 12, for example, the chip $C_M$ comprises: a substrate layer $L_{SB}$; a memory cell array layer $L_{MCA}$ provided below the substrate layer $L_{SB}$; and a plurality of wiring layers M0, M1, M2 provided below the memory cell array layer $L_{MCA}$.

[Structure of Substrate Layer $L_{SB}$ of Chip $C_M$]

As shown in FIG. 12, for example, the substrate layer $L_{SB}$ comprises: an insulating layer 183 provided on the back surface of the chip $C_M$; a wiring layer $L_{MA}$ provided below the insulating layer 183; an insulating layer 182 provided below the wiring layer $L_{MA}$; and a wiring layer $L_{BSL}$ provided below the insulating layer 182.

The insulating layer 183 is configured from a passivation film of a polyimide or the like, silicon nitride ($Si_3N_4$), silicon oxide ($SiO_2$), and so on, for example.

The wiring layer $L_{MA}$ includes a conductive material such as aluminum (Al), for example. The wiring layer $L_{MA}$ includes: a conductive layer MA10(CELSRC) provided in the memory cell array region $R_{MCA}$; and a conductive layer MA20 and a conductive layer MA30 provided in the peripheral region $R_P$.

The insulating layer 182 is configured from silicon nitride ($Si_3N_4$), silicon oxide ($SiO_2$), and so on, for example.

The wiring layer $L_{BSL}$ includes a semiconductor layer of the likes of polycrystalline silicon (Si) implanted with an N type impurity such as phosphorus (P) or a P type impurity such as boron (B), for example. The wiring layer $L_{BSL}$ includes: a conductive layer BSL10 provided in the memory cell array region $R_{MCA}$; a conductive layer BSL20 provided in the peripheral region $R_P$; and a ring-shaped conductive layer BSL30 surrounding a periphery of an opening BA. A slit 180 is provided between the conductive layer BSL10 and the conductive layer BSL20, and the insulating layer 182 is provided in this slit 180. The conductive layer BSL10 and the conductive layer BSL20 are electrically insulated from each other. A slit 181 is provided between the conductive layer BSL20 and the conductive layer BSL30, and the insulating layer 182 is provided in this slit 181. The conductive layer BSL20 and the conductive layer BSL30 are electrically insulated from each other. The conductive layer BSL20 which is in a periphery of the broadly-ranging memory plane MP is fixed at the ground voltage $V_{SS}$ or is in a floating state close to the ground voltage $V_{SS}$.

Moreover, although not illustrated, in the memory cell array region $R_{MCA}$ of the substrate layer $L_{SB}$, a plurality of contacts may be provided between the conductive layer MA30 and the conductive layer BSL20. The contact extends in the Z-direction, and is connected at its upper end to the conductive layer MA30 and at its lower end to the conductive layer BSL20. The contact may include for example the likes of a stacked film in which there are stacked a barrier conductive film of titanium nitride (TiN), or the like, and a metal film of tungsten (W), or the like.

[Structure in Memory Cell Array Region $R_{MCA}$ of Memory Cell Array Layer $L_{MCA}$ of Chip $C_M$]

As shown in FIG. 12, for example, the memory cell array region $R_{MCA}$ is provided with a plurality of the memory blocks BLK arranged in the Y-direction. The memory block BLK comprises a plurality of the string units SU arranged in the Y-direction. An inter-block insulating layer ST of the likes of silicon oxide ($SiO_2$) is provided between two memory blocks BLK adjacent in the Y-direction. An inter-string unit insulating layer SHE of the likes of silicon oxide ($SiO_2$) is provided between two string units SU adjacent in the Y-direction.

Figure 13:
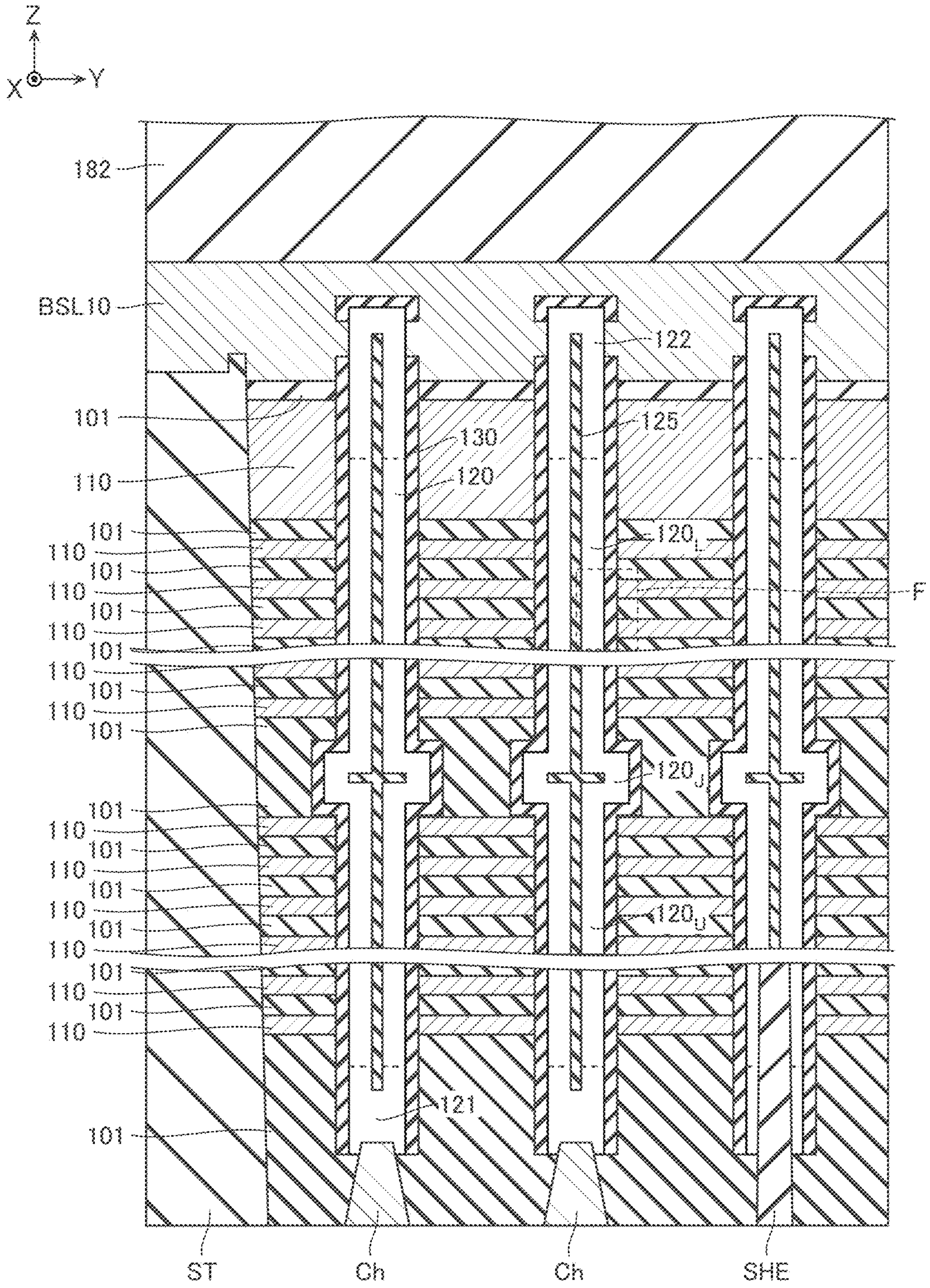
FIG. 13 is a schematic cross-sectional view showing a part of the configuration of the same semiconductor memory device.
Figure 14:
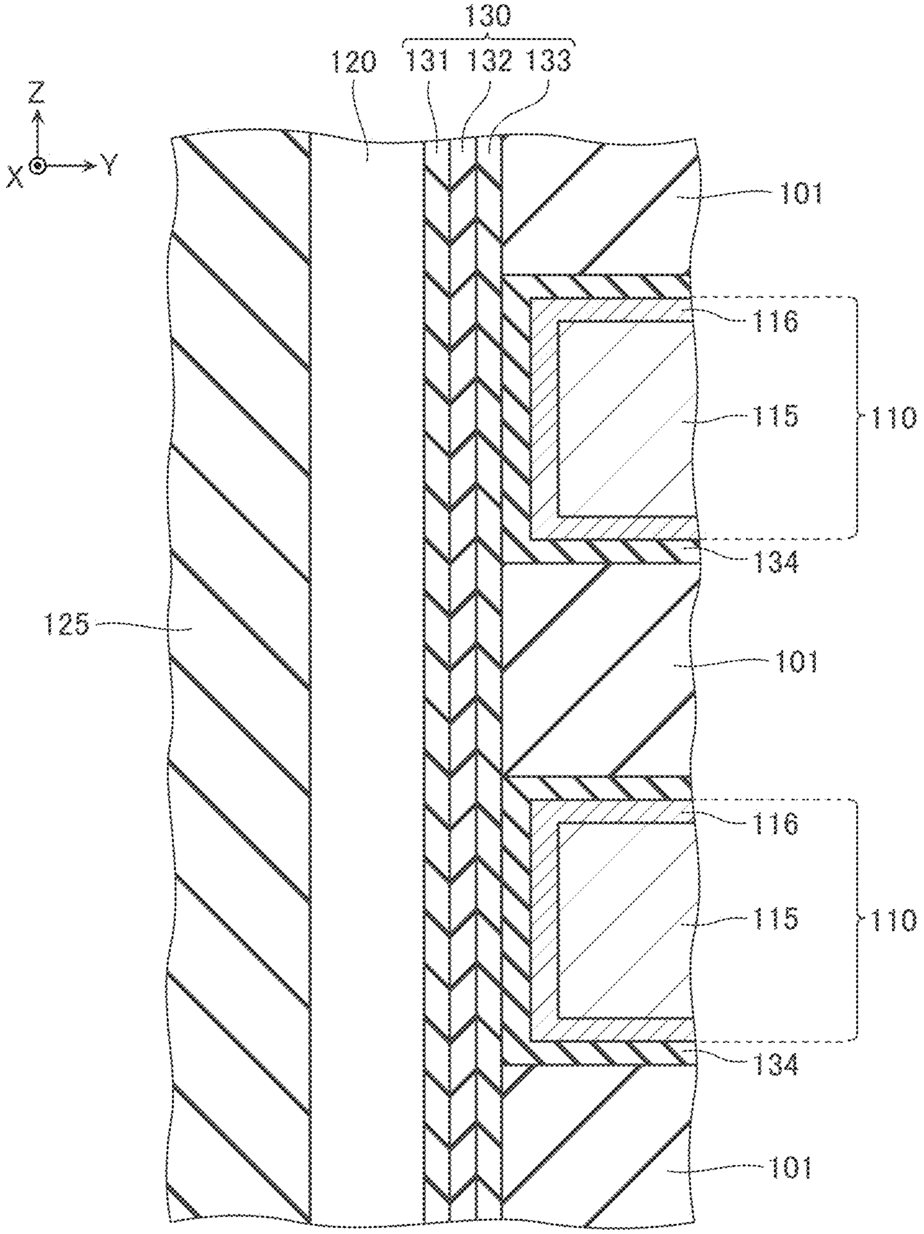
FIG. 14 is a schematic cross-sectional view showing a part of the configuration of the same semiconductor memory device.

FIG. 13 is a schematic cross-sectional view showing enlarged the memory cell array region $R_{MCA}$. FIG. 14 is a schematic enlarged view of the portion indicated by F in FIG. 13. Note that although FIG. 14 shows a YZ cross section, a similar structure to that of FIG. 14 will be observed even when a cross section other than the YZ cross section (for example, an XZ cross section) along a central axis of a semiconductor column 120 is observed.

As shown in FIG. 13, for example, the memory block BLK comprises: a plurality of conductive layers 110 arranged in the Z-direction; a plurality of the semiconductor columns 120 extending in the Z-direction; and a plurality of gate insulating films 130 respectively provided between the plurality of conductive layers 110 and the plurality of semiconductor columns 120.

The conductive layer 110 is a substantially plate-like conductive layer extending in the X-direction. As shown in FIG. 14, the conductive layer 110 may include a stacked film that includes: a barrier conductive film 116 of the likes of titanium nitride (TiN); and a metal film 115 of the likes of tungsten (W). Note that an insulating metal oxide film 134 of the likes of alumina (AlO) may be provided at a position covering an outer periphery of the barrier conductive film 116. Moreover, the conductive layer 110 may include the likes of polycrystalline silicon including an impurity such as phosphorus (P) or boron (B), for example. An insulating layer 101 of the likes of silicon oxide ($SiO_2$) is provided between the plurality of conductive layers 110 arranged in the Z-direction.

As shown in FIG. 13, the above-mentioned conductive layer BSL10 is provided above the conductive layers 110. The conductive layer BSL10 is connected to an upper end of the semiconductor column 120. The insulating layer 101 of the likes of silicon oxide ($SiO_2$) is provided between the conductive layers 110 and the conductive layer BSL10. The conductive layer BSL10 functions as the source line SL (FIG. 5). The source line SL is commonly provided for all of the memory blocks BLK included in the memory cell array region $R_{MCA}$ (FIG. 11 and FIG. 12), for example.

One or a plurality of conductive layers 110 located in the uppermost layer, of the plurality of conductive layers 110 function as the source side select gate line SGS (FIG. 5) and as gate electrodes of the plurality of source side select transistors STS (FIG. 5) connected to this source side select gate line SGS. These plurality of conductive layers 110 are electrically independent every memory block BLK.

Moreover, a plurality of conductive layers 110 located below these uppermost layer-located conductive layers 110 function as the word lines WL (FIG. 5) and as the gate electrodes of the pluralities of memory cells MC (FIG. 5) connected to these word lines WL. These plurality of conductive layers 110 are each electrically independent every memory block BLK.

Moreover, one or a plurality of conductive layers 110 located below these word line WL-functioning conductive layers 110 function as the drain side select gate line SGD (FIG. 5) and as the gate electrodes of the plurality of drain side select transistors STD (FIG. 5) connected to this drain side select gate line SGD. A width in the Y-direction of these plurality of conductive layers 110 is smaller than that of the other conductive layers 110. Moreover, the inter-string unit insulating layer SHE is provided between two of the conductive layers 110 adjacent in the Y-direction. These plurality of conductive layers 110 are each electrically independent every string unit SU.

As shown in FIG. 11 and FIG. 12, for example, the semiconductor columns 120 are arranged in a certain pattern in the X-direction and the Y-direction. The semiconductor column 120 functions as channel regions of the plurality of memory cells MC and the select transistors (STD, STS) included in one memory string MS (FIG. 5). The semiconductor column 120 is a semiconductor layer of the likes of polycrystalline silicon (Si), for example. An insulating layer 125 (FIG. 13) of the likes of silicon oxide is provided in a central portion of the semiconductor column 120.

As shown in FIG. 13, the semiconductor column 120 comprises: a semiconductor region $120_L$; and a semiconductor region $120_U$ which is provided below the semiconductor region $120_L$. In addition, the semiconductor column 120 comprises: a semiconductor region $120_J$ which is connected to a lower end of the semiconductor region $120_L$ and to an upper end of the semiconductor region $120_U$; an impurity region 122 which is connected to an upper end of the semiconductor region $120_L$; and an impurity region 121 which is connected to a lower end of the semiconductor region $120_U$.

The semiconductor region $120_L$ and the semiconductor region $120_U$ are substantially cylindrically-shaped regions that extend in the Z-direction. Outer peripheral surfaces of the semiconductor region $120_L$ and the semiconductor region $120_U$ are respectively surrounded by pluralities of the conductive layers 110 included in the memory cell array layer $L_{MCA}$, and are opposed to these pluralities of conductive layers 110.

The impurity region 121 includes an N type impurity such as phosphorus (P), for example. In the example of FIG. 13, a boundary line of a lower end portion of the semiconductor region $120_U$ and an upper end portion of the impurity region 121 is indicated by a broken line. The impurity region 121 is connected to the bit line BL via a contact Ch and a contact Vy (FIG. 11 and FIG. 12).

The impurity region 122 includes an N type impurity such as phosphorus (P) or a P type impurity such as boron (B), for example. In the example of FIG. 13, a boundary line of an upper end portion of the semiconductor region $120_L$ and a lower end portion of the impurity region 122 is indicated by a broken line. The impurity region 122 is connected to the conductive layer BSL10.

Note that as mentioned above, the conductive layer BSL10 is connected to the conductive layer MA10 via a plurality of contacts V10. The conductive layer MA10, which includes a conductive material such as aluminum (Al), for example, and is low resistance, functions as an auxiliary wiring of the conductive layer BSL10 functioning as the source line SL. Note that the conductive layer BSL10 may be provided over a region overlapping a plurality of the semiconductor columns 120, viewed from the Z-direction.

The gate insulating film 130 has a cylindrical shape covering an outer peripheral surface of the semiconductor column 120. As shown in FIG. 14, for example, the gate insulating film 130 comprises a tunnel insulating film 131, an electric charge accumulating film 132, and a block insulating film 133 that are stacked between the semiconductor column 120 and the conductive layer 110. The tunnel insulating film 131 and the block insulating film 133 are insulating films of the likes of silicon oxide ($SiO_2$), for example. The electric charge accumulating film 132 which is of the likes of silicon nitride ($Si_3N_4$), for example, is a film capable of accumulating a charge. The tunnel insulating film 131, the electric charge accumulating film 132, and the block insulating film 133 have substantially cylindrical shapes, and extend in the Z-direction along the outer peripheral surface of the semiconductor column 120.

Note that FIG. 14 shows an example where the gate insulating film 130 comprises an electric charge accumulating film 132 of the likes of silicon nitride. However, the gate insulating film 130 may comprise a floating gate of the likes of polycrystalline silicon including an N type or a P type impurity, for example.

[Structure in Hookup Region $R_{HU}$ of Memory Cell Array Layer $L_{MCA}$ of Chip $C_M$]

As shown in FIG. 11, the hook-up region $R_{HU}$ is provided with a plurality of contacts CC. These plurality of contacts CC, which extend in the Z-direction, are respectively connected at their upper ends to the conductive layers 110. These plurality of contacts CC are connected to configurations in the chip $C_P$ via wirings m0, m1 in the wiring layers M0, M1, and the first bonding electrodes $P_{I1}$ in the wiring layer M2. The contact CC may include for example the likes of a stacked film in which there are stacked a barrier conductive film of titanium nitride (TiN), or the like, and a metal film of tungsten (W), or the like.

[Structure in Peripheral Region $R_P$ of Memory Cell Array Layer $L_{MCA}$ of Chip $C_M$]

As shown in FIG. 12, for example, the peripheral region $R_P$ is provided with a contact CC30. The contact CC30 has a part thereof connected at its upper end to a lower surface of the conductive layer MA20, and has a part thereof connected at its lower end to the wiring m0, and so on, which will be mentioned later.

[Structure of Wiring Layers M0, M1, M2 of Chip $C_M$]

As shown in FIG. 11 and FIG. 12, for example, the plurality of wirings included in the wiring layers M0, M1, M2 are electrically connected to at least one of configurations in the memory cell array layer $L_{MCA}$ and configurations in the chip $C_P$, for example.

The wiring layer M0 includes a plurality of the wirings m0. These plurality of wirings m0 may include for example the likes of a stacked film in which there are stacked a barrier conductive film of titanium nitride (TiN), tantalum nitride (TaN), or the like, and a metal film of copper (Cu), or the like. Note that a part of the plurality of wirings m0 function as the bit line BL (FIG. 5). As shown in FIG. 11 and FIG. 12, for example, the bit lines BL are arranged in the X-direction and extend in the Y-direction. Moreover, these plurality of bit lines BL are each connected to one semiconductor column 120 included in each string unit SU.

As shown in FIG. 11 and FIG. 12, for example, the wiring layer M1 includes a plurality of the wirings m1. These plurality of wirings m1 may include for example the likes of a stacked film in which there are stacked a barrier conductive film of titanium nitride (TiN), tantalum nitride (TaN), or the like, and a metal film of copper (Cu), or the like.

The wiring layer M2 includes a plurality of the first bonding electrodes Pr. These plurality of first bonding electrodes $P_{I1}$ may include for example the likes of a stacked film in which there are stacked a barrier conductive film of titanium nitride (TiN), tantalum nitride (TaN), or the like, and a metal film of copper (Cu), or the like.

[Structure of Chip $C_P$]

As shown in FIG. 10, for example, the chip $C_P$ comprises four peripheral circuit regions $R_{PC}$ arranged in the X and Y-directions correspondingly to the memory planes MP. The peripheral circuit region $R_{PC}$ comprises: a sense amplifier module region $R_{SAM}$ provided in part of a region opposed to the memory cell array region $R_{MCA}$; and a row decoder region $R_{RD}$ provided in a region opposed to the hook-up region $R_{HU}$. In addition, the chip $C_P$ comprises a circuit region $R_C$ provided in a region opposed to the peripheral region $R_P$.

Moreover, as shown in FIG. 11 and FIG. 12, for example, the chip $C_P$ comprises: a semiconductor substrate 200; a transistor layer $L_{TR}$ provided above the semiconductor substrate 200; and a plurality of wiring layers M0', M1', M2', M3', M4' provided above the transistor layer $L_{TR}$.

[Structure of Semiconductor Substrate 200 of Chip $C_P$]

The semiconductor substrate 200 is configured from P type silicon (Si) including a P type impurity such as boron (B), for example. As shown in FIG. 11 and FIG. 12, for example, a surface of the semiconductor substrate 200 is provided with: an N type well region 200N including an N type impurity such as phosphorus (P); a P type well region 200P including a P type impurity such as boron (B); a semiconductor substrate region 200S where the N type well region 200N and the P type well region 200P are not provided; and an insulating region 2001. The N type well region 200N, the P type well region 200P, and the semiconductor substrate region 200S respectively function as parts of a plurality of transistors Tr, and as parts of a plurality of capacitors, and so on, configuring the peripheral circuit PC.

[Structure of Transistor Layer $L_{TR}$ of Chip $C_P$]

As shown in FIG. 11 and FIG. 12, for example, a wiring layer GC is provided on an upper surface of the semiconductor substrate 200, via an insulating layer 200G. The wiring layer GC includes a plurality of electrodes gc opposed to the surface of the semiconductor substrate 200. Moreover, each of the regions of the semiconductor substrate 200 and the plurality of electrodes gc included in the wiring layer GC are respectively connected to contacts CS.

The N type well region 200N, the P type well region 200P, and the semiconductor substrate region 200S of the semiconductor substrate 200 respectively function as channel regions of the plurality of transistors Tr and as one of the electrodes of the plurality of capacitors, and so on, configuring the peripheral circuit PC.

The plurality of electrodes gc included in the wiring layer GC respectively function as gate electrodes of the plurality of transistors and as the other of the electrodes of the plurality of capacitors, and so on, configuring the peripheral circuit PC.

The contact CS extends in the Z-direction, and is connected at its lower end to an upper surface of the semiconductor substrate 200 or the electrode gc. A connecting portion of the contact CS and the semiconductor substrate 200 is provided with an unillustrated high concentration impurity region including an N type impurity or a P type impurity. The contact CS may include for example the likes of a stacked film in which there are stacked a barrier conductive film of titanium nitride (TiN), or the like, and a metal film of tungsten (W), or the like.

[Structure of Wiring Layers M0', M1', M2', M3', M4' of Chip $C_P$]

The wiring layer M0' is provided above the transistor layer $L_{TR}$. The wiring layer M0' includes a conductive material such as tungsten (W), for example. The wiring layer M1' is provided above the wiring layer M0'. The wiring layer M1' includes a conductive material such as copper (Cu), for example. The wiring layer M2', while not explicitly shown in FIG. 11 and FIG. 12, is provided above the wiring layer M1'. The wiring layer M2' includes a conductive material such as copper (Cu), for example. The wiring layer M3' includes a conductive material such as copper (Cu) or aluminum (Al), for example. The wiring layer M4' includes a conductive material such as copper (Cu), for example, and comprises a plurality of the second bonding electrodes $P_{I2}$.

[Detailed Configuration of Periphery of External Pad Electrode $P_X$ of Chip $C_M$]

Next, detailed configuration of a periphery of the external pad electrode $P_X$ will be described. FIG. 8 shows a pattern viewed from an upper surface in the Z-direction, of the slits 180, 181 formed in the wiring layer $L_{BSL}$. The conductive layer BSL10 formed at a position of a pair of the memory planes MP adjacent in the Y-direction, of the four memory planes MP is separated from the conductive layer BSL20 in its periphery by the ring-shaped slit 180. Moreover, at least a part of the external pad electrodes $P_X$ indicated in a range of Pa, of the plurality of external pad electrodes $P_X$ are employed as the data signal input/output terminals DQ0 to DQ7, the data strobe signal input/output terminals DQS, /DQS, the data bus inversion signal input/output terminal DBI, the ZQ calibration-purposed terminal ZQ, and the external control terminals /CE, CLE, ALE, /WE, /RE, RE (hereafter, these terminals will sometimes be collectively referred to as "signal terminals"). Regarding the external pad electrode $P_X$ for these signal terminals, the ring-shaped slit 181 is formed along a peripheral edge portion of the conductive layer MA20 including the external pad electrode $P_X$. The conductive layer BSL30 opposed to the peripheral edge portion of the conductive layer MA20 is separated from the conductive layer BSL20 in its periphery by the ring-shaped slit 181. On the other hand, at least a part of the external pad electrodes $P_X$ indicated in a range of Pb, of the plurality of external pad electrodes $P_X$ are employed as power supply terminals. The power supply terminals are terminals applied with power supply voltages $V_{CCQ}$, $V_{CCQL}$, the power supply voltage $V_{CC}$, a power supply voltage $V_{PP}$, and the ground voltage $V_{SS}$. The conductive layer MA20 of the power supply terminals is basically similar in configuration to the conductive layer MA20 of the signal terminals, but differs in configuration from the conductive layer MA20 of the signal terminals in not having the slit 181 formed in the conductive layer BSL20.

Figure 15:
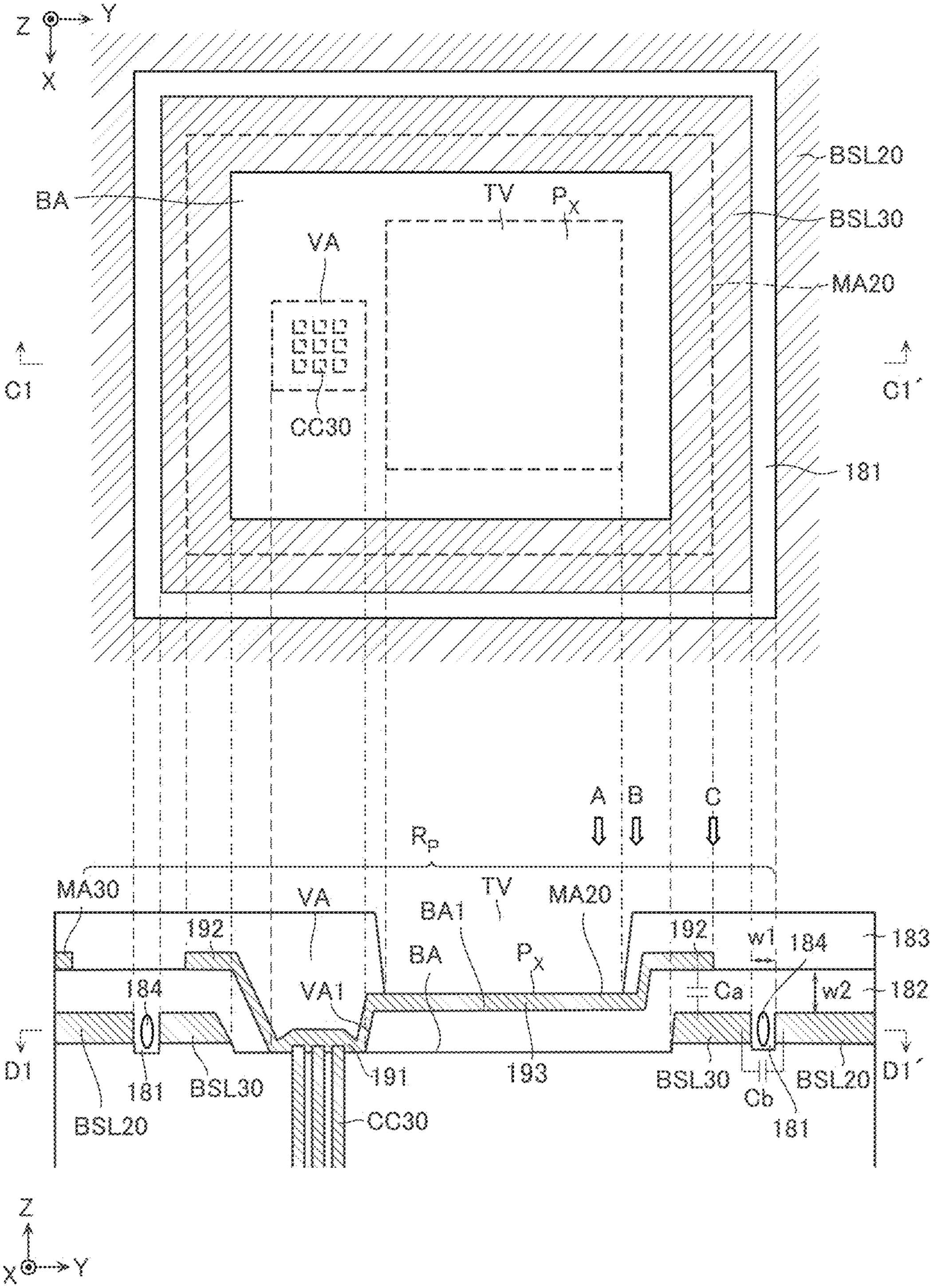
FIG. 15 is a schematic cross-sectional view showing a part of the configuration of the same semiconductor memory device.

FIG. 15 is a view showing further details of the external pad electrode $P_X$ of the signal terminals. The upper portion of FIG. 15 is a cross-sectional view in which the lower portion of FIG. 15 has been cut at the line D1-D1' and viewed from the direction of the arrows (the Z-direction). The lower portion of FIG. 15 is a cross-sectional view in which the upper portion of FIG. 15 has been cut along the line C1-C1' and viewed from the direction of the arrows (the X-direction).

The conductive layer MA20 is formed as an isolated pattern separated from the conductive layers MA10, MA30 in its periphery, viewed from the Z-direction. The conductive layer MA20 has: a connecting portion 191 connected to an upper end of the contact CC30; a pad electrode portion 193 forming the external pad electrode $P_X$; and a peripheral edge portion 192 provided in a periphery of these connecting portion 191 and the pad electrode portion 193.

The conductive layer BSL30 has the opening BA. The opening BA is formed with a size capable of housing the connecting portion 191 and the pad electrode portion 193 of the conductive layer MA20. The insulating layer 182 is provided inside the opening BA. The insulating layer 182 inside the opening BA has an opening VA1. The connecting portion 191 of the conductive layer MA20 is electrically connected to a configuration in the chip $C_P$ via the contact CC30. Hereafter, the connecting portion 191 with the contact CC30 of the conductive layer MA20, and the opening VA1 will sometimes be collectively referred to as an opening structure VA.

The pad electrode portion 193 of the conductive layer MA20 is adjacent to the connecting portion 191, and formed on the insulating layer 182 inside the opening BA. An upper surface of the pad electrode portion 193 is exposed to outside of the memory die MD via an opening TV provided in the insulating layer 183. This exposed portion of the pad electrode portion 193 functions as the external pad electrode $P_X$.

The peripheral edge portion 192 of the conductive layer MA20 is opposed to the conductive layer BSL30 in the Z-direction via the insulating layer 182. The conductive layer BSL30 is formed in a ring-like manner by the ring-shaped slit 181 formed along a periphery of the conductive layer MA20 and by the opening BA. The conductive layer BSL30 is separated from the conductive layer BSL20 on its outer side, and is in a floating state.

As shown in the lower portion of FIG. 15, a position in the Z-direction of the pad electrode portion 193 of the conductive layer MA20 ends up being between the connecting portion 191 and the peripheral edge portion 192.

Advantages of First Embodiment

From a viewpoint of connection resistance, the connecting portion 191 is directly connected to the contact CC30, without being mediated by the conductive layer BSL30 which is formed by a semiconductor material such as polycrystalline silicon. Moreover, a film thickness of a portion joining the pad electrode portion 193 and the connecting portion 191 of the conductive layer MA20 easily becomes thin due to there being a level difference between the pad electrode portion 193 and the connecting portion 191. When the film thickness becomes too thin, there is a possibility of a disconnection, or the like, occurring due to electromigration. Hence, the level difference between the connecting portion 191 and the pad electrode portion 193 is desirably as small as possible. For this reason, the conductive layer BSL30 on a lower side of the pad electrode portion 193 is provided with the opening BA. As a result, the pad electrode portion 193 is disposed more to a lower side than the peripheral edge portion 192.

Positions A, B, C shown in the lower portion of FIG. 15 are conceivable as positions of separation of the conductive layer MA10 in order to make the conductive layer MA20 an isolated pattern. However, due to a level difference in the Z-direction existing between the pad electrode portion 193 and the peripheral edge portion 192, when separation is carried out at the position A, then positions in the Z-direction of the peripheral edge portion 192 and the position A will differ, thus resulting in that as well as there being required a step for formation of a wiring pattern in the same layer as the peripheral edge portion 192, there will additionally be required a step for separation at the position A. When separation is carried out at the position B, there is a possibility of metal remaining in a portion of the level difference, and a malfunction occurring. Hence, it is desirable for separation to be carried out at the position C.

In this case, the peripheral edge portion 192 is formed via the insulating layer 182 on the conductive layer BSL30. Since the peripheral edge portion 192 is opposed to the conductive layer BSL30 in the Z-direction, the peripheral edge portion 192 has a coupling capacitance Ca between itself and the conductive layer BSL30. When this coupling capacitance Ca is large, then a delay in signal transmission is generated in the external pad electrode $P_X$ for the signal terminals. Accordingly, in the present embodiment, the slit 181 is formed, whereby the conductive layer BSL30 is separated from the conductive layer BSL20 on its outer side. As a result, the conductive layer BSL30 attains a floating state, and can cause the coupling capacitance Ca between itself and the conductive layer MA20 and a coupling capacitance Cb between itself and the conductive layer BSL20, to be reduced.

A width w1 of the slit 181 may be set to 0.1 to 0.5 times a film thickness w2 of the insulating layer 182 formed on a top portion of the slit 181. When this range is adopted, there does not occur a level difference at a portion of the slit 181 in the insulating layer 182 on the top portion of the slit 181, and formation of the wiring layer $L_{MA}$ on a top portion of the insulating layer 182 will be facilitated.

Moreover, as shown in the lower portion of FIG. 15, an air gap 184 may be formed inside the slit 181. By the air gap 184 being formed, the coupling capacitance Cb can be further reduced.

Figure 16:
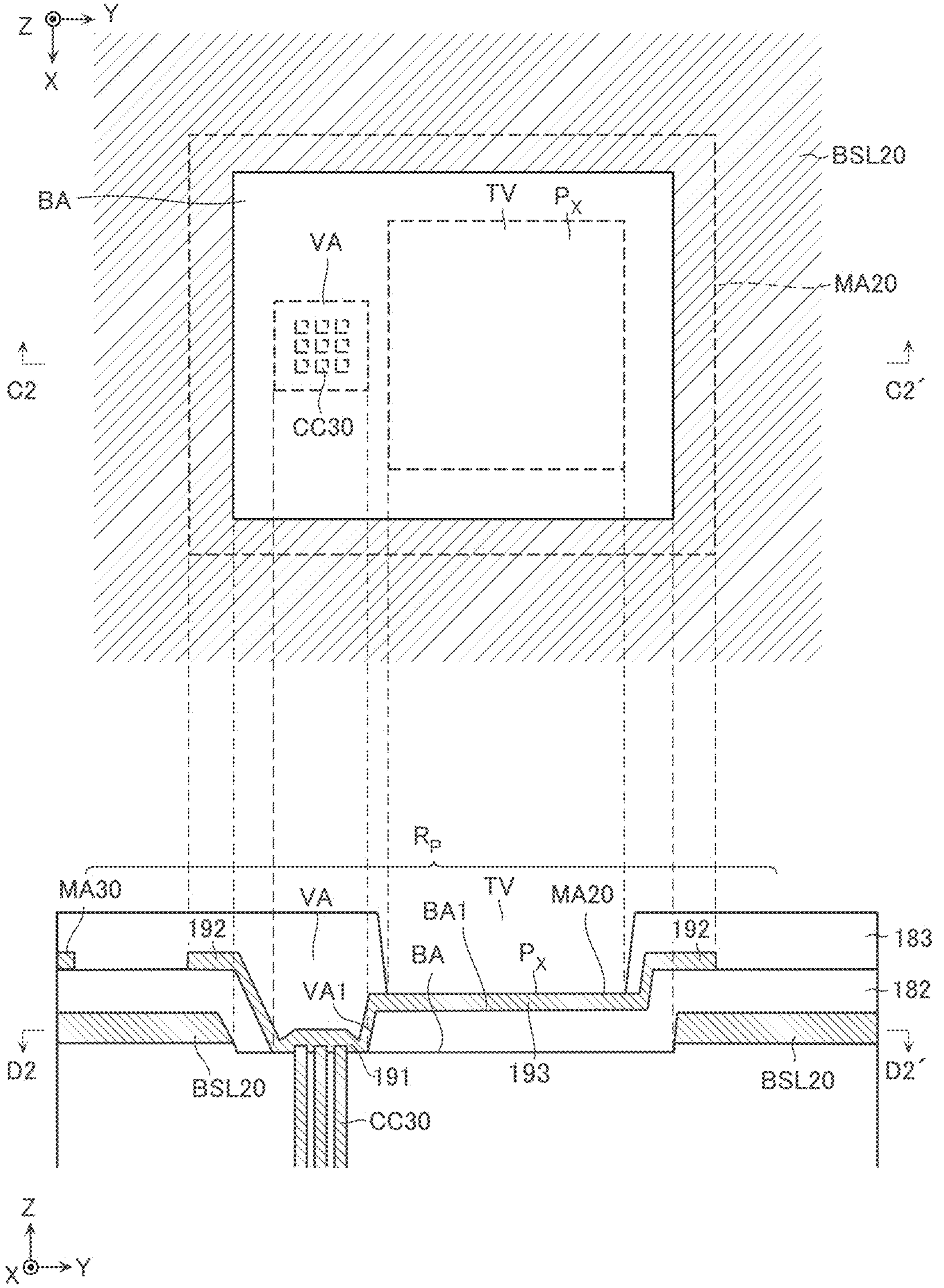
FIG. 16 is a schematic cross-sectional view showing a part of the configuration of the same semiconductor memory device.

FIG. 16 is a view showing further details of the external pad electrode $P_X$ of the power supply terminals. The upper portion of FIG. 16 is a cross-sectional view in which the lower portion of FIG. 16 has been cut at the line D2-D2' and viewed from the direction of the arrows (the Z-direction). The lower portion of FIG. 16 is a cross-sectional view in which the upper portion of FIG. 16 has been cut along the line C2-C2' and viewed from the direction of the arrows (the X-direction).

The power supply terminals are terminals applied with the power supply voltages $V_{CCQ}$, $V_{CCQL}$, $V_{CC}$, $V_{PP}$, and the ground voltage $V_{SS}$. The conductive layer MA20 of the power supply terminals is basically similar in configuration to the conductive layer MA20 of the signal terminals, but differs in configuration from the conductive layer MA20 of the signal terminals in not having the slit 181 formed in the conductive layer BSL20. In other words, the conductive layer BSL20 surrounding via the slit 181 the periphery of the external pad electrode $P_X$ of the signal terminals is extended to a position opposed to in the Z-direction the peripheral edge portion 192 provided in the periphery of the external pad electrode $P_X$ of the power supply terminals. Note that although the conductive layer MA20 is exemplified here as an isolated pattern, there is no particular need for it to be configured as an isolated pattern, and it may be connected to another place via a wiring pattern.

In the case of the power supply terminals, generally, voltage does not change, so if anything, it is desirable for coupling capacitance between the conductive layer MA20 and the conductive layer BSL20 to be large. However, since height of the external pad electrode $P_X$ of the power supply terminals needs to be made equal to height of the external pad electrode $P_X$ of the signal terminals, the conductive layer MA20 has a similar level difference structure to that of the signal terminals.

[Method of Manufacturing]

Next, a method of manufacturing the memory die MD according to the first embodiment will be described with reference to FIG. 17 to FIG. 25. FIG. 17 to FIG. 25 are schematic cross-sectional views for explaining the same method of manufacturing, and show cross sections corresponding to FIG. 12.

Note that for steps up to bonding of the chip CM and the chip $C_P$, a publicly known method of manufacturing can be used, so those steps will be omitted, and a description will be given below for the manufacturing method after bonding.

Figure 17:
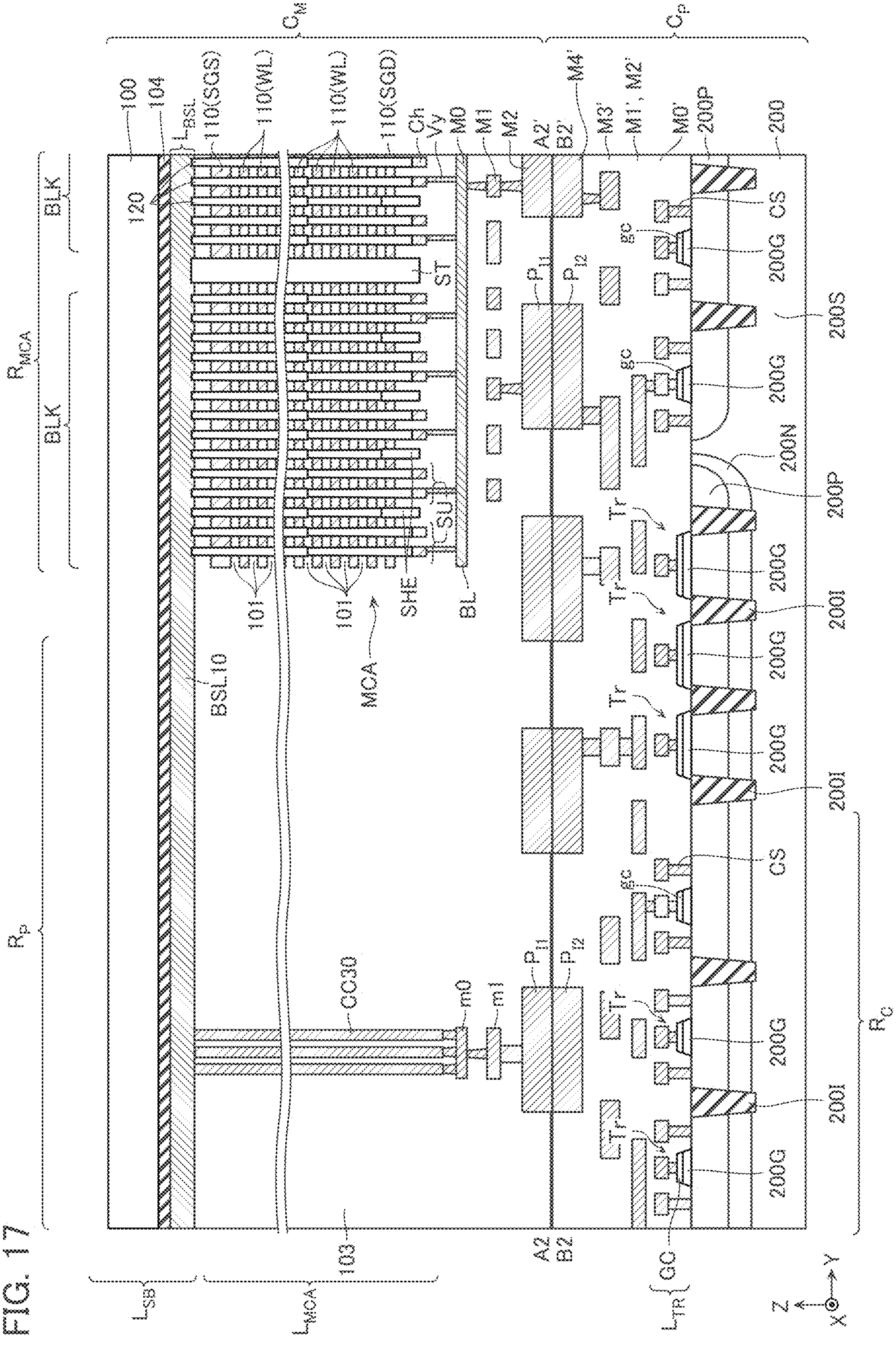
FIG. 17 is a schematic cross-sectional view showing a part of the configuration of the same semiconductor memory device which is for explaining a method of manufacturing the same semiconductor memory device.

As shown in FIG. 17, a wafer in which the chip $C_M$ has been priorly formed in a certain step and a wafer in which the chip $C_P$ has been priorly formed in a separate step are arranged and bonded so that the first bonding electrodes $P_{I1}$ and the second bonding electrodes $P_{I2}$ will be connected. In this bonding step, for example, one of the wafers is pressed toward the other of the wafers thereby closely adhering the two, and heat treatment or the like is performed. As a result, the wafer where the chip $C_M$ is formed is bonded to the wafer where the chip $C_P$ is formed, via the first bonding electrodes $P_{I1}$ and the second bonding electrodes $P_{I2}$.

Figure 18:
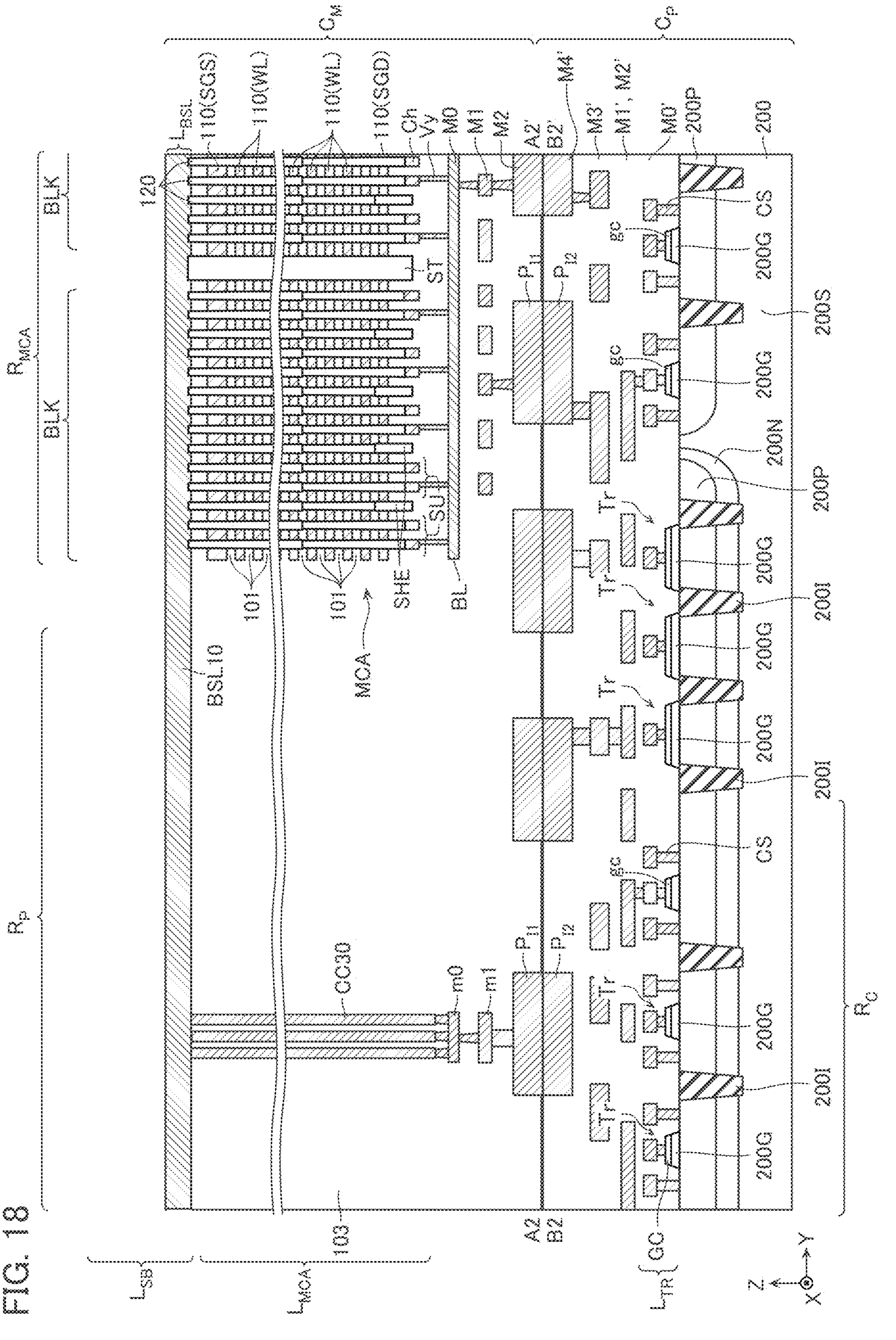
FIG. 18 is a schematic cross-sectional view showing a part of the configuration of the same semiconductor memory device which is for explaining the method of manufacturing the same semiconductor memory device.

Next, as shown in FIG. 18, for example, a substrate 100 and a insulating layer 104 included in the chip $C_M$ are removed.

Figure 19:
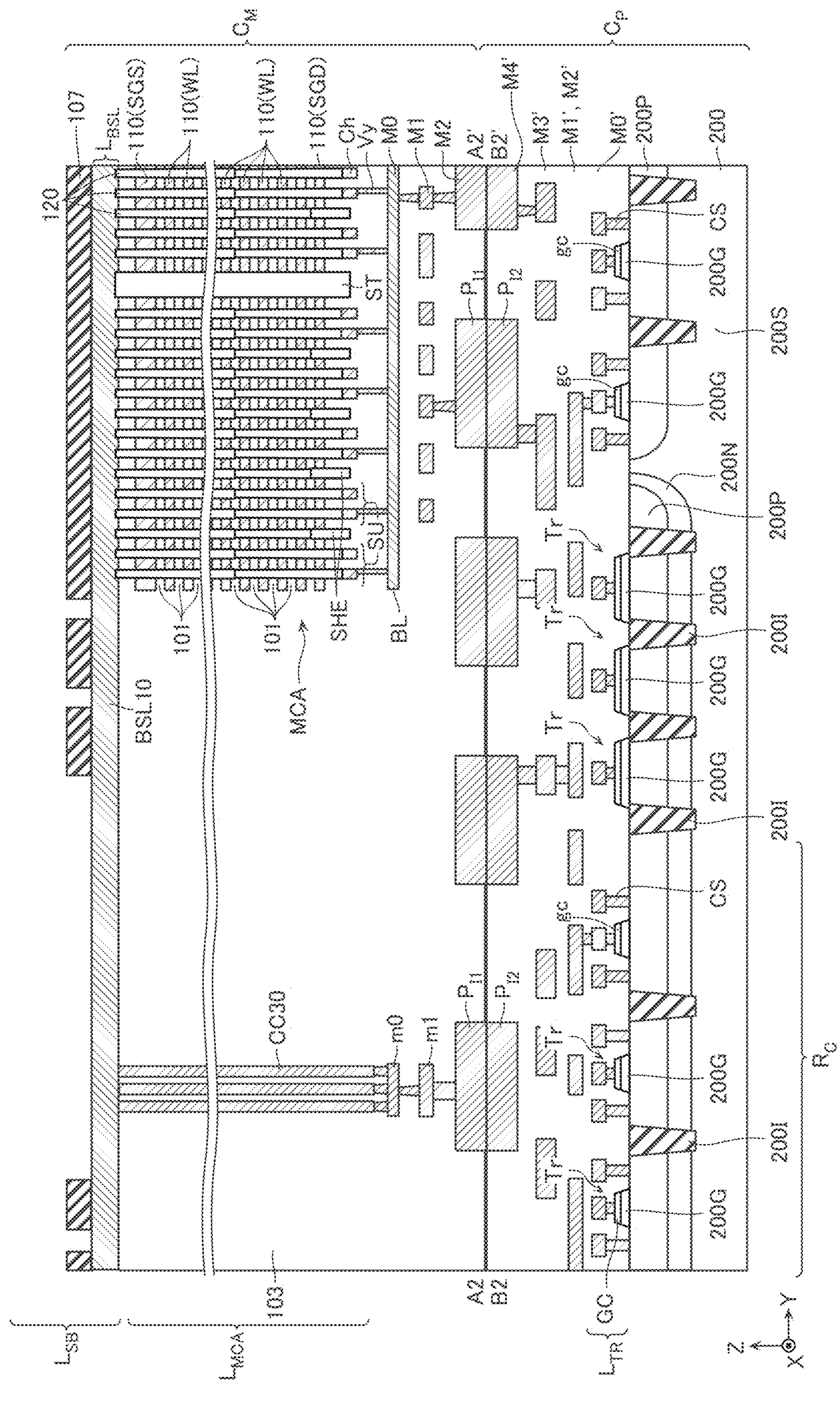
FIG. 19 is a schematic cross-sectional view showing a part of the configuration of the same semiconductor memory device which is for explaining the method of manufacturing the same semiconductor memory device.
Figure 20:
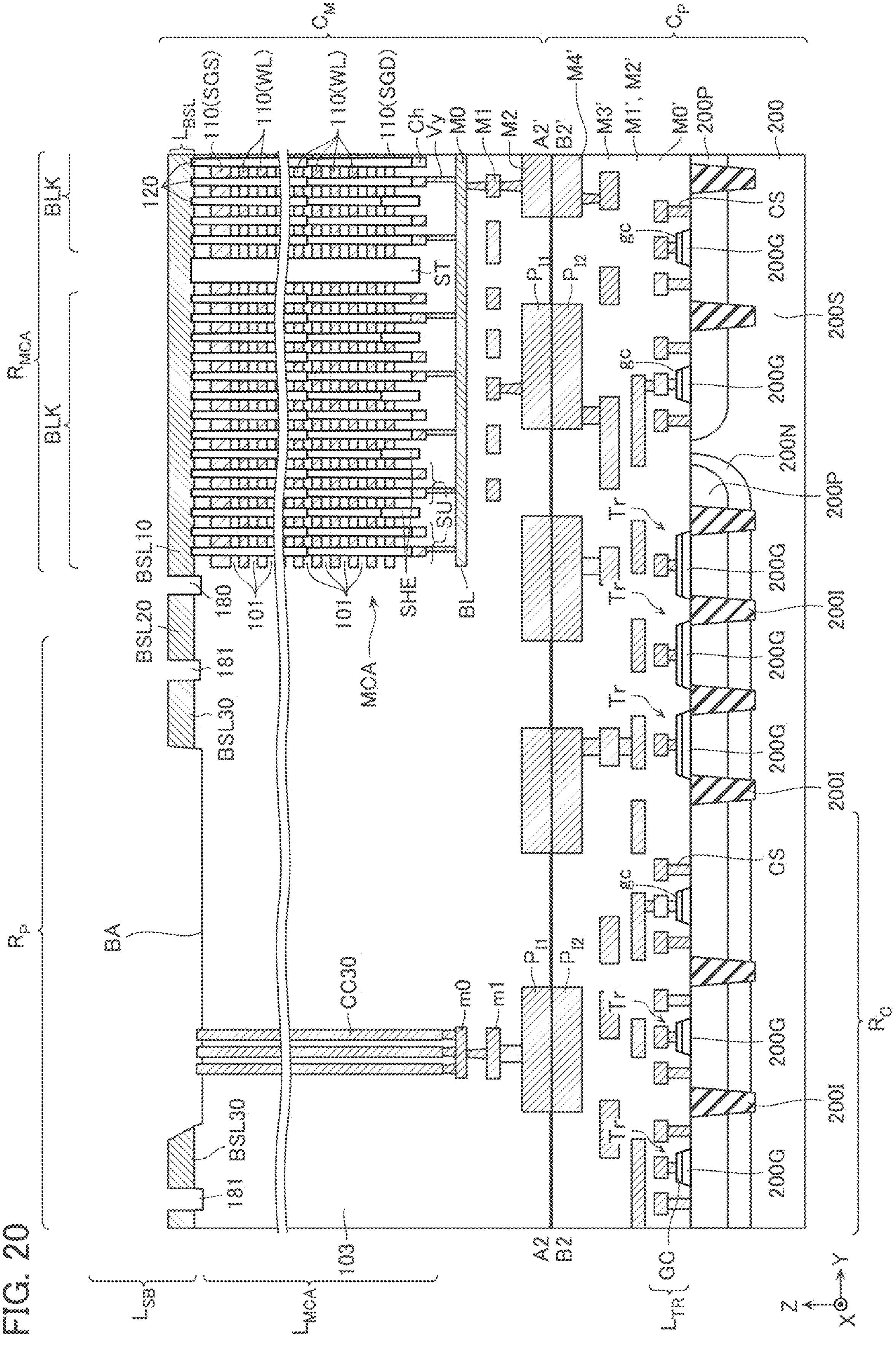
FIG. 20 is a schematic cross-sectional view showing a part of the configuration of the same semiconductor memory device which is for explaining the method of manufacturing the same semiconductor memory device.

Next, as shown in FIG. 19, for example, a resist is formed on the conductive layer BSL10, and a mask 107 is formed by a method of photoetching. The mask 107 is used to form the opening BA and slits 180, 181 in the conductive layer BSL10, as shown in FIG. 20. As a result, the conductive layers BSL20 and BSL30 separated from the conductive layer BSL10 are formed. This step is performed by a method such as RIE (Reactive Ion Etching), for example.

Figure 21:
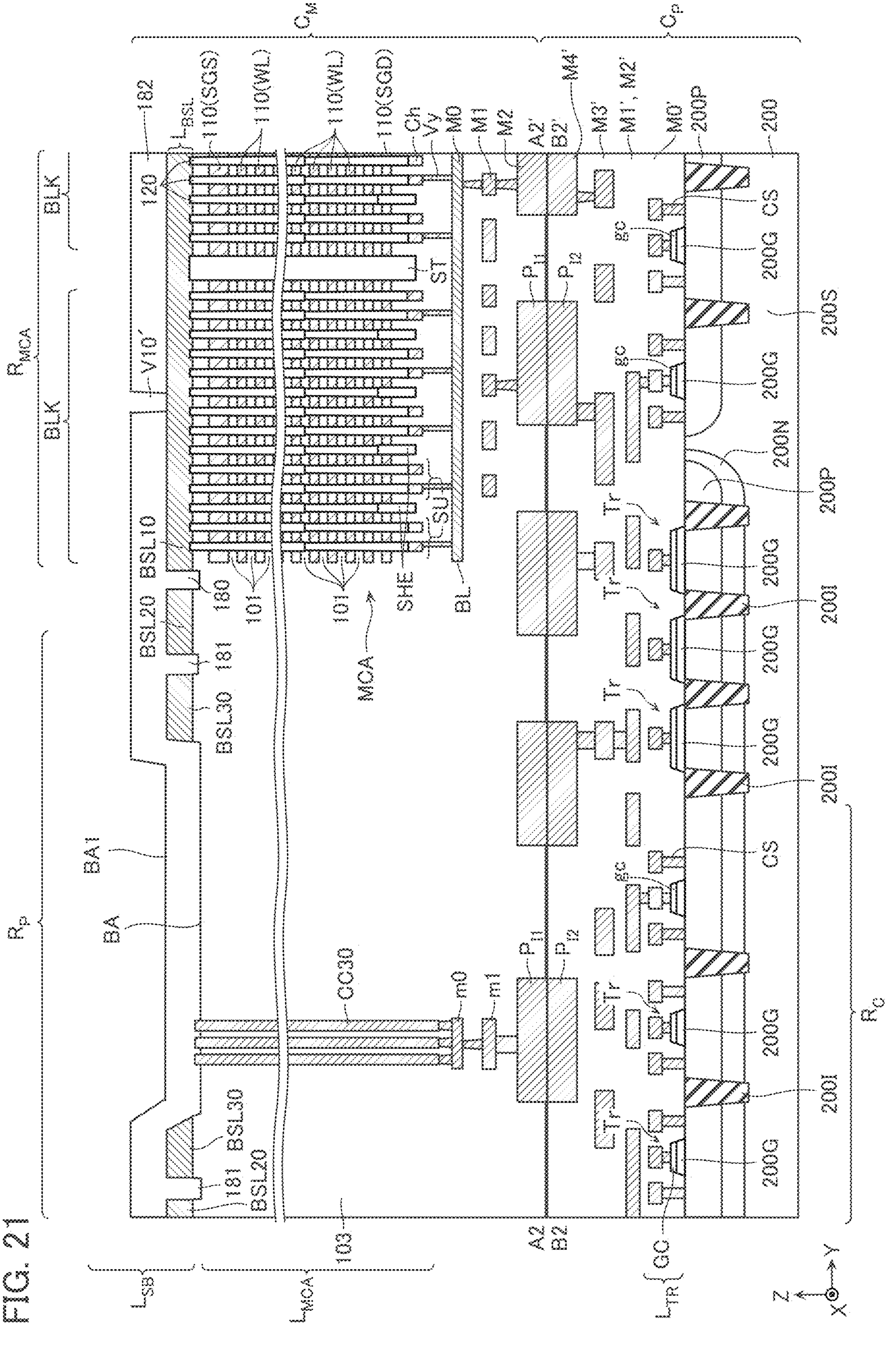
FIG. 21 is a schematic cross-sectional view showing a part of the configuration of the same semiconductor memory device which is for explaining the method of manufacturing the same semiconductor memory device.

Next, as shown in FIG. 21, for example, the insulating layer 182 of the likes of silicon oxide ($SiO_2$) is formed on the conductive layers BSL10, BSL20, BSL30, and inside the opening BA and slits 180, 181. This step is performed by a method such as CVD (Chemical Vapor Deposition), for example.

Figure 22:
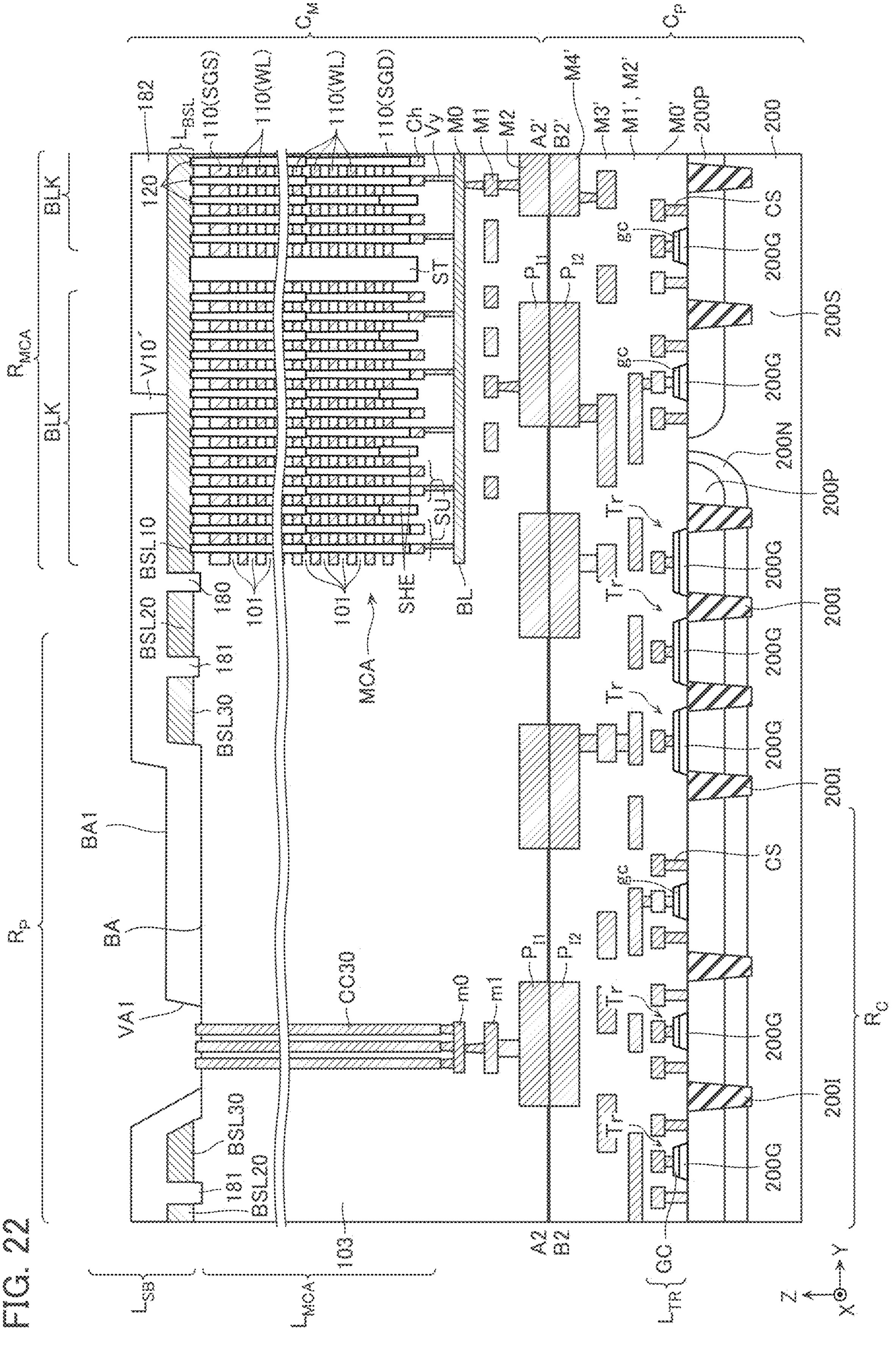
FIG. 22 is a schematic cross-sectional view showing a part of the configuration of the same semiconductor memory device which is for explaining the method of manufacturing the same semiconductor memory device.

Next, a resist is formed on the insulating layer 182, and an unillustrated mask is formed by a method of photoetching. This mask is used to remove the insulating layer 182 on the contact CC30 and form the opening VA1, as shown in FIG. 22, for example. This step is performed by a method such as RIE, for example. As a result, the upper end of the contact CC30 is exposed on a top portion.

Figure 23:
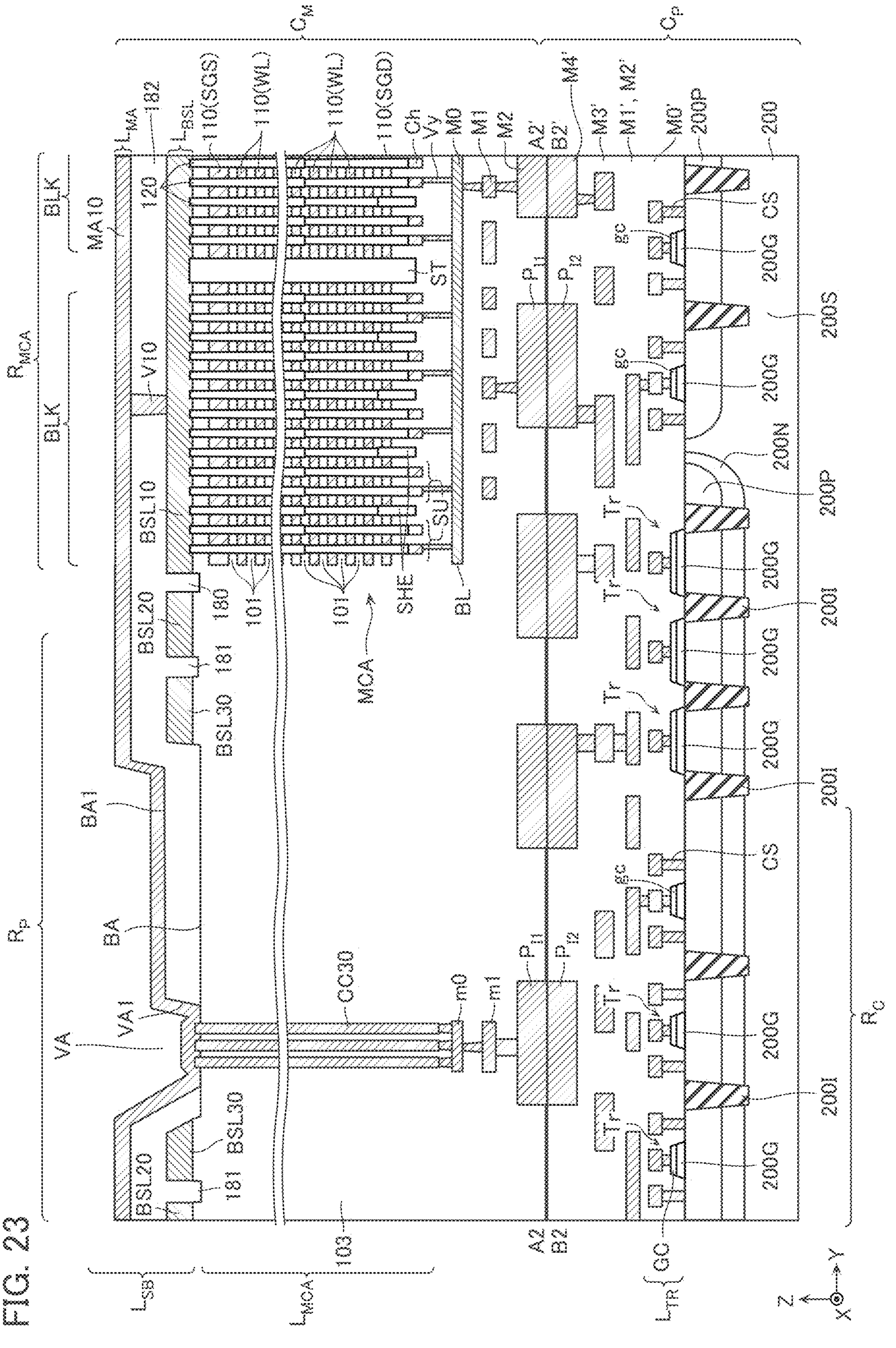
FIG. 23 is a schematic cross-sectional view showing a part of the configuration of the same semiconductor memory device which is for explaining the method of manufacturing the same semiconductor memory device.

Next, as shown in FIG. 23, for example, the conductive layer MA10 of the likes of Al is formed in the opening VA1 and on an upper surface of insulating layer 182. This step is performed by a method such as CVD, for example.

Figure 24:
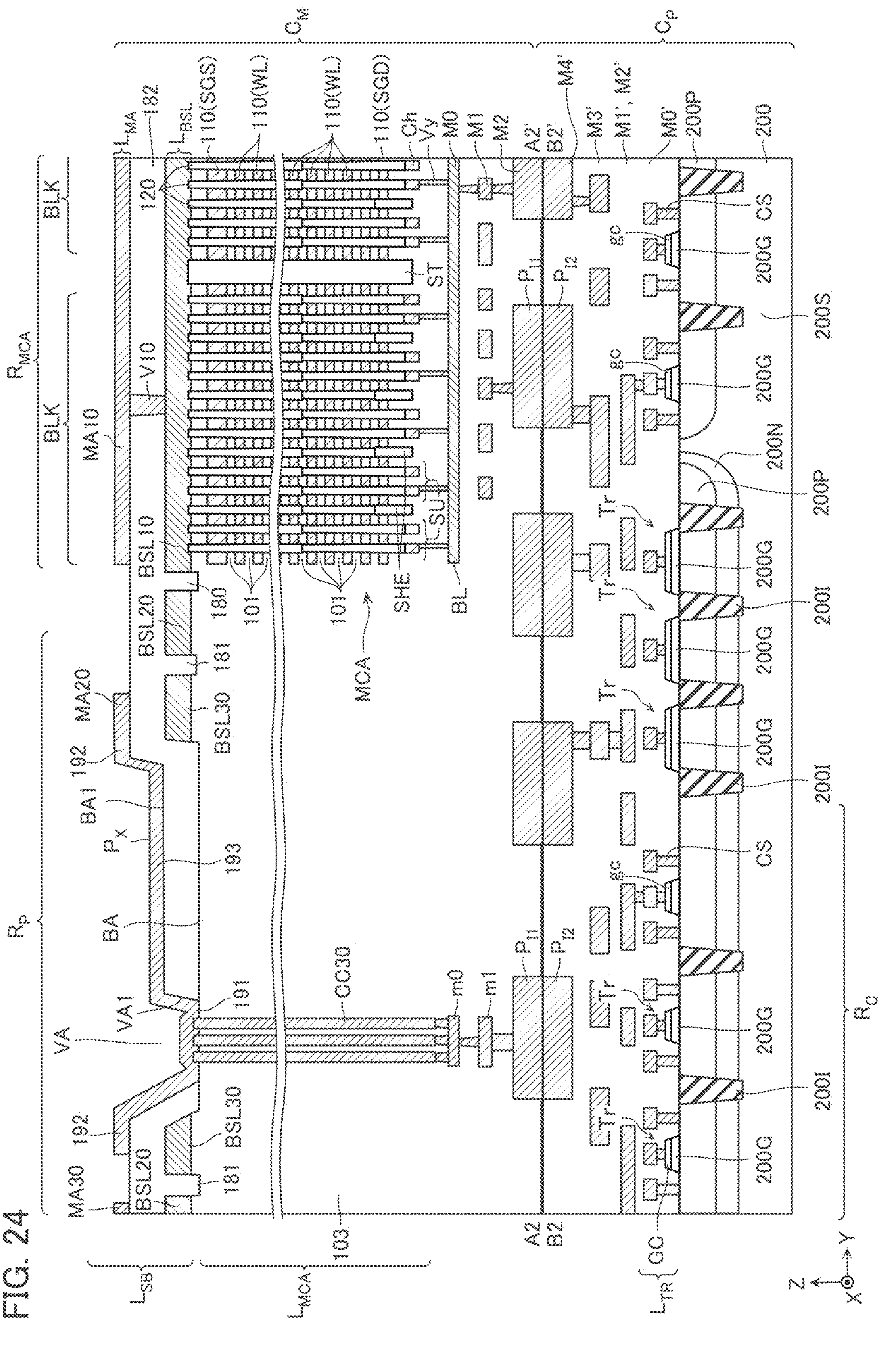
FIG. 24 is a schematic cross-sectional view showing a part of the configuration of the same semiconductor memory device which is for explaining the method of manufacturing the same semiconductor memory device.

Next, as shown in FIG. 24, for example, a resist is formed on the conductive layer MA10, and an unillustrated mask is formed by a method of photoetching. This mask is used to remove unnecessary portions of the conductive layer MA10 and form a certain wiring pattern including the conductive layer MA20, as shown in FIG. 24, for example. This step is performed by a method such as RIE, for example.

Figure 25:
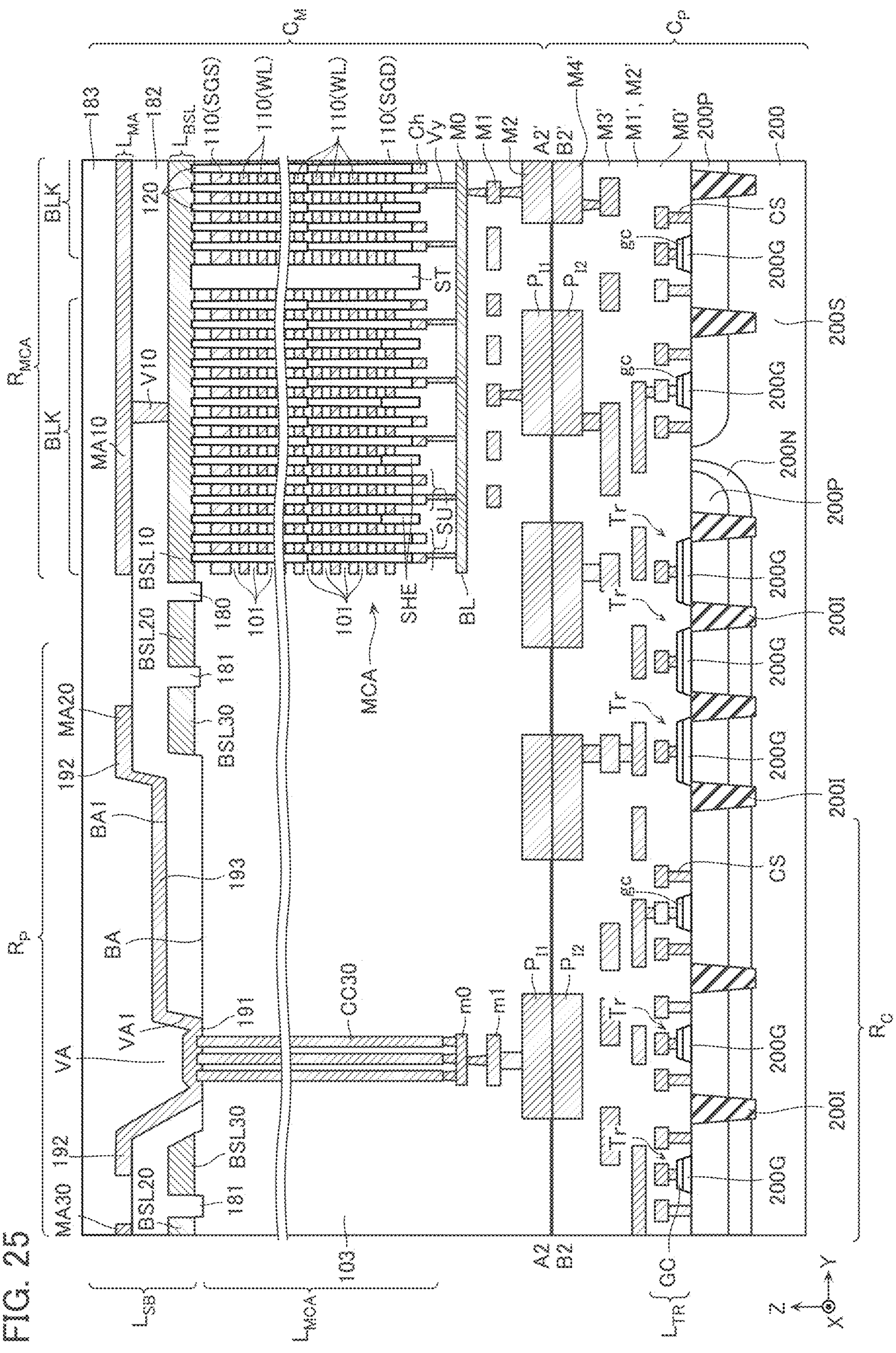
FIG. 25 is a schematic cross-sectional view showing a part of the configuration of the same semiconductor memory device which is for explaining the method of manufacturing the same semiconductor memory device.

Next, as shown in FIG. 25, for example, the insulating layer 183 is formed on the likes of the conductive layer MA10 and the conductive layer MA20. This step is performed by methods such as CVD and CMP (Chemical Mechanical Polishing), for example.

Next, due to the insulating layer 183 undergoing the likes of mask formation by photoetching, RIE, and so on, the insulating layer 183 on the upper surface of the pad electrode portion 193 of the conductive layer MA20 is removed, and the upper surface of the pad electrode portion 193 is exposed, whereby the external pad electrode $P_X$ of the kind shown in FIG. 12 is formed.

Second Embodiment

Figure 26:
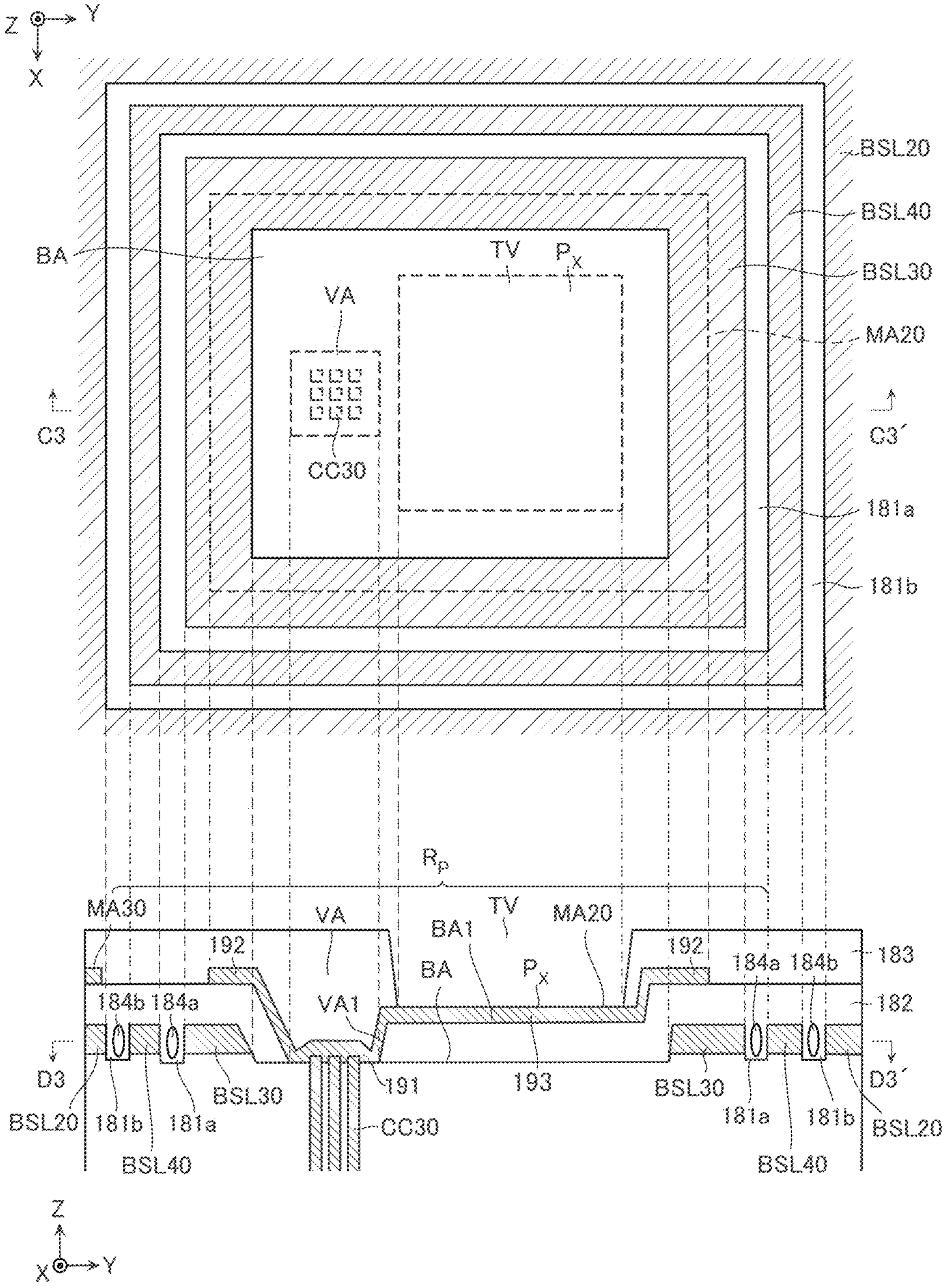
FIG. 26 is a schematic cross-sectional view showing a part of a configuration of a semiconductor memory device according to a second embodiment.

Next, a semiconductor memory device according to a second embodiment will be described with reference to FIG. 26. FIG. 26 is a view showing details of the external pad electrode $P_X$ of the signal terminals of the semiconductor memory device according to the second embodiment, and shows a portion corresponding to FIG. 15. The upper portion of FIG. 26 is a cross-sectional view in which the lower portion of FIG. 26 has been cut at the line D3-D3' and viewed from the direction of the arrows (the Z-direction). The lower portion of FIG. 26 is a cross-sectional view in which the upper portion of FIG. 26 has been cut along the line C3-C3' and viewed from the direction of the arrows (the X-direction). Note that in the description below, description will sometimes be omitted for configurations similar to in the first embodiment.

The second embodiment basically has a similar configuration to the first embodiment. However, the second embodiment differs from the first embodiment in that in the present embodiment, two slits 181*a*, 181*b* are formed in the periphery of the conductive layer BSL30, and a ring-shaped conductive layer BSL40 is formed on an outer side of the ring-shaped conductive layer BSL30. The ring-shaped conductive layers BSL30, BSL40 are both separated from their peripheries to be in a floating state.

Due to the second embodiment, two slits 181*a*, 181*b* are formed, so coupling capacitance between the conductive layer MA20 and the conductive layer BSL20 can be reduced more greatly, and signal delay can be reduced even further than in the first embodiment.

Note that the number of slits may be three or more. Moreover, as shown in the lower portion of FIG. 26, air gaps 184*a*, 184*b* may be respectively formed in each of the slits 181*a*, 181*b*. When the air gaps 184*a*, 184*b* are formed, then coupling capacitance between the conductive layer MA20 and the conductive layer BSL20 can be further reduced. Moreover, a width of each of the slits 181*a*, 181*b* may be set to 0.1 to 0.5 times film thickness of the insulating layer 182 formed on top portions of the slits 181*a*, 181*b*. When this range is adopted, there does not occur a level difference in the insulating layer 182 on the top portions of the slits 181*a*, 181*b*, and formation of the wiring layer $L_{MA}$ will be facilitated.

Third Embodiment

Figure 27:
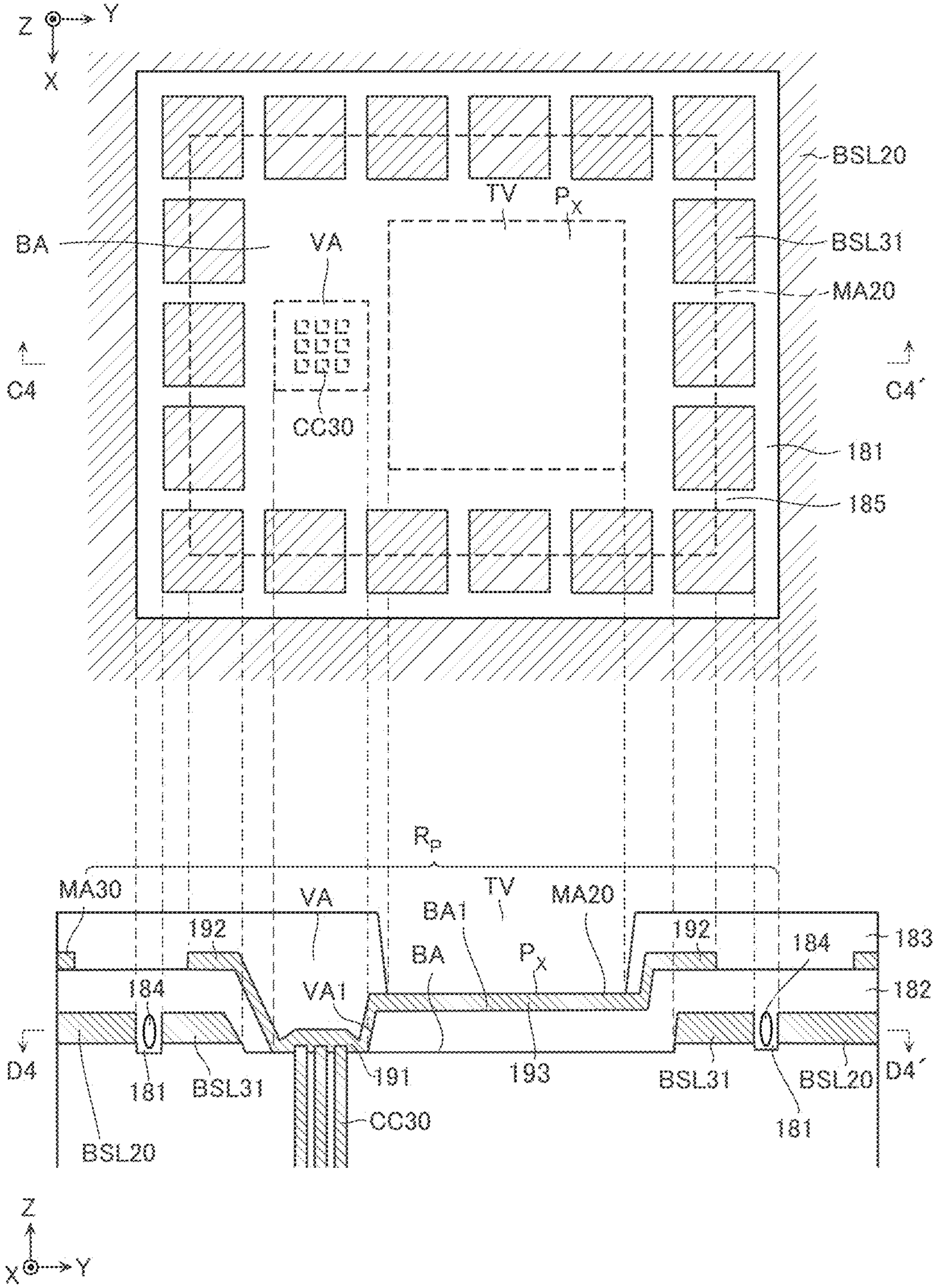
FIG. 27 is a schematic cross-sectional view showing a part of a configuration of a semiconductor memory device according to a third embodiment.

Next, a semiconductor memory device according to a third embodiment will be described with reference to FIG. 27. FIG. 27 is a view showing details of the external pad electrode $P_X$ of the signal terminals of the semiconductor memory device according to the third embodiment, and shows a portion corresponding to FIG. 15. The upper portion of FIG. 27 is a cross-sectional view in which the lower portion of FIG. 27 has been cut at the line D4-D4' and viewed from the direction of the arrows (the Z-direction). The lower portion of FIG. 27 is a cross-sectional view in which the upper portion of FIG. 27 has been cut along the line C4-C4' and viewed from the direction of the arrows (the X-direction). Note that in the description below, description will sometimes be omitted for configurations similar to in the first embodiment.

The third embodiment basically has a similar configuration to the first embodiment. However, in the present embodiment, a conductive layer BSL31 disposed in a periphery of the opening BA differs from in the first embodiment. In the third embodiment, there is included a slit 185 that joins the slit 181 and the opening BA. The conductive layers BSL31 are formed as a respectively separated rectangular island-shaped pattern, disposed in a ring-like manner in the periphery of the opening BA. The respective conductive layers BSL31 are all separated from their peripheries to be in a floating state.

Due to the third embodiment, the conductive layers BSL31 are configured as an island-shaped pattern disposed in a ring-like manner, so coupling capacitance between the conductive layer MA20 and the conductive layer BSL20 can be further reduced, and signal delay can be further reduced.

Note that the number of slits 185 is not limited to the number exemplified here, and may be further increased or reduced. Moreover, as shown in the lower portion of FIG. 27, the air gaps 184 may be respectively formed in each of the slits 181, 185. When the air gaps 184 are formed, then coupling capacitance between the conductive layer MA20 and the conductive layer BSL20 can be further reduced. Moreover, a width of each of the slits 181, 185 may be set to 0.1 to 0.5 times the film thickness of the insulating layer 182 formed on the top portions of the slits 181, 185. If this range is adopted, there does not occur a level difference in the insulating layer 182 on the top portion of the slits 181, 185, and formation of the wiring layer $L_{MA}$ will be facilitated.

Fourth Embodiment

Figure 28:
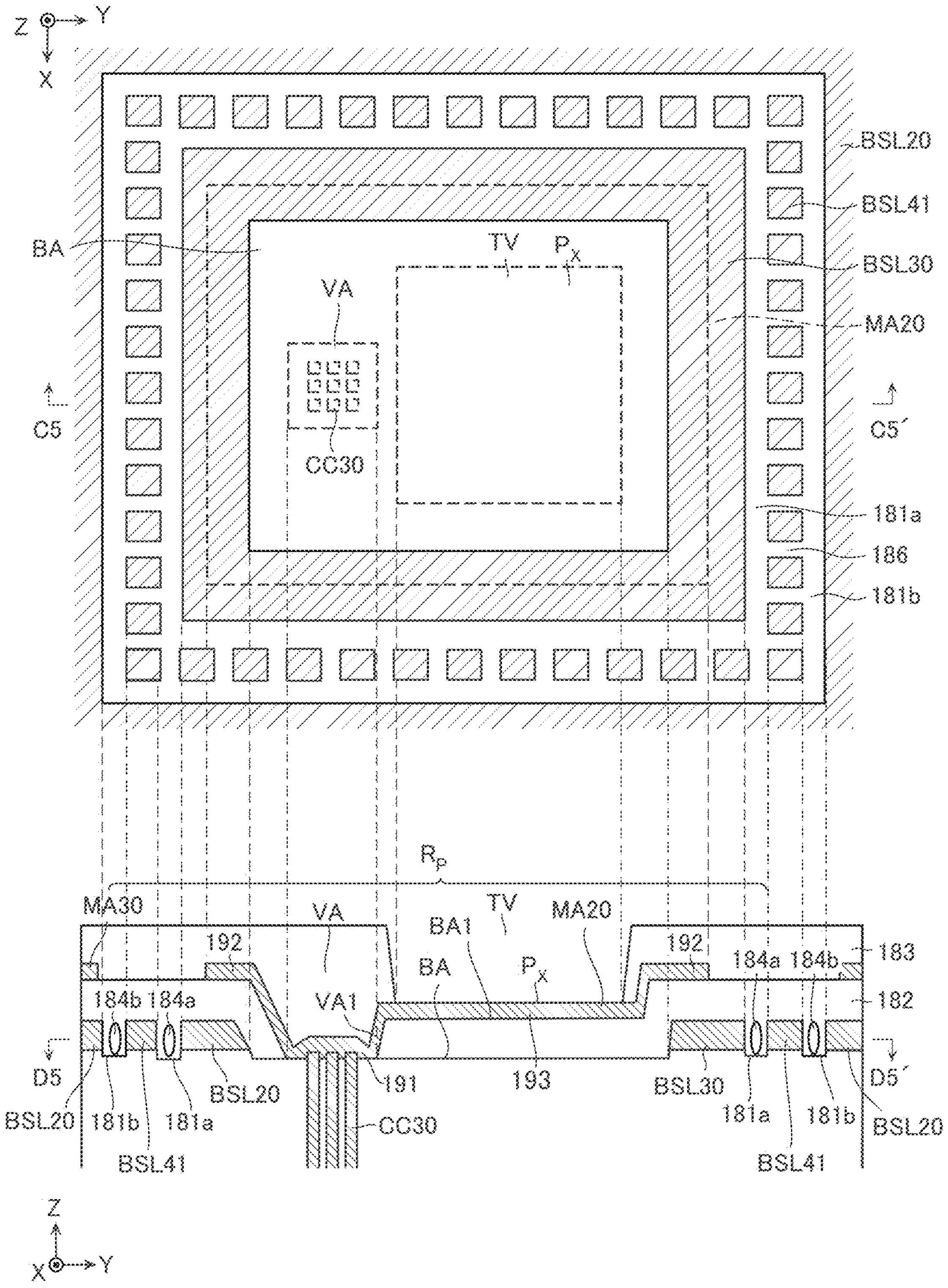
FIG. 28 is a schematic cross-sectional view showing a part of a configuration of a semiconductor memory device according to a fourth embodiment.

Next, a semiconductor memory device according to a fourth embodiment will be described with reference to FIG. 28. FIG. 28 is a view showing details of the external pad electrode $P_X$ of the signal terminals of the semiconductor memory device according to the fourth embodiment, and shows a portion corresponding to FIG. 15. The upper portion of FIG. 28 is a cross-sectional view in which the lower portion of FIG. 28 has been cut at the line D5-D5' and viewed from the direction of the arrows (the Z-direction). The lower portion of FIG. 28 is a cross-sectional view in which the upper portion of FIG. 28 has been cut along the line C5-C5' and viewed from the direction of the arrows (the X-direction). Note that in the description below, description will sometimes be omitted for configurations similar to in the first through third embodiments.

The fourth embodiment basically has a similar configuration to the first embodiment. However, the fourth embodiment differs from the first embodiment in that in the present embodiment, the two slits 181*a*, 181*b* are formed in the periphery of the conductive layer BSL30, and there is included a slit 186 that joins the slit 181*a* and the slit 181*b*. In the fourth embodiment, conductive layers BSL41 between the slits 181*a*, 181*b* are formed as a respectively separated rectangular island-shaped pattern, disposed in a ring-like manner between the slits 181*a*, 181*b*. The ring-shaped conductive layer BSL30 and respective conductive layers BSL41 are all separated from their peripheries to be in a floating state.

Due to the fourth embodiment, the two slits 181*a*, 181*b* are formed, and the conductive layers BSL41 between the two slits 181*a*, 181*b* are configured as an island-shaped pattern disposed in a ring-like manner, so coupling capacitance between the conductive layer MA20 and the conductive layer BSL20 can be further reduced, and signal delay can be further reduced.

Note that the number of slits 181*a*, 181*b* may be three or more. Moreover, the number of slits 186 is not limited to the number exemplified here, and may be further increased or reduced. Moreover, as shown in the lower portion of FIG. 28, the air gaps 184*a*, 184*b* may be respectively formed in each of the slits 181*a*, 181*b*, 186. When the air gaps 184*a*, 184*b* are formed, then coupling capacitance between the conductive layer MA20 and the conductive layer BSL20 can be further reduced. Moreover, a width of each of the slits 181*a*, 181*b*, 186 may be set to 0.1 to 0.5 times the film thickness of the insulating layer 182 formed on the top portions of the slits 181*a*, 181*b*, 186. When this range is adopted, there does not occur a level difference in the insulating layer 182 on the top portions of the slits 181*a*, 181*b*, 186, and formation of the wiring layer $L_{MA}$ will be facilitated.

Modification 1 of First Embodiment

Figure 29:
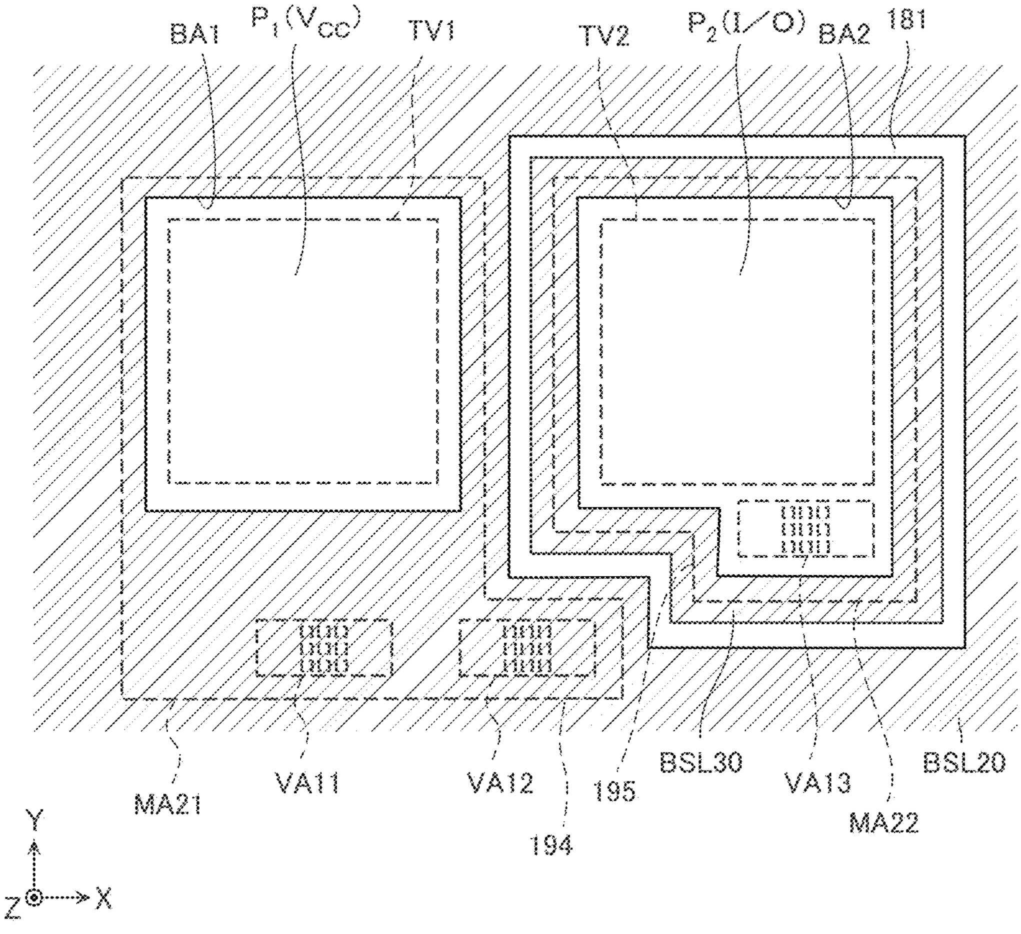
FIG. 29 is a schematic cross-sectional view showing a part of a configuration of a semiconductor memory device according to modification 1 of the first embodiment.

Next, a semiconductor memory device according to modification 1 of the first embodiment will be described with reference to FIG. 29. FIG. 29 is a view showing details of the external pad electrode $P_X$ of the signal terminals and power supply terminals of the semiconductor memory device according to modification 1 of the first embodiment, and is a schematic view enlarging part of FIG. 8. FIG. 29 shows a cross section in which the memory die MD has been cut along the XY plane at a position of the wiring layer $L_{BSL}$ in the Z-direction, and viewed from the Z-direction. Note that in the description below, description will sometimes be omitted for configurations similar to in the first embodiment.

Modification 1 of the first embodiment basically has a similar configuration to the first embodiment. However, in the present modification, shapes of a conductive layer MA21 including an external pad electrode $P_1(V_{CC})$ connected to the power supply terminals and a conductive layer MA22 including an external pad electrode $P_2$(I/O) connected to the signal terminals, are both non-rectangular.

The conductive layer MA21 for power supply terminals has two opening structures VA11, VA12. In order for the opening structures VA11, VA12 to be formed, the conductive layer MA21 has a protrusion 194 that protrudes toward the adjacent conductive layer MA22 for signal terminals. The external pad electrode $P_1(V_{CC})$ is formed correspondingly to an opening BA1, and is exposed to outside by an opening TV1.

The conductive layer MA22 for signal terminals has one opening structure VA13. The conductive layer MA22 has a notch 195 corresponding to the protrusion 194 of the adjacent conductive layer MA21 for power supply terminals. The external pad electrode $P_2$(I/O) is formed correspondingly to an opening BA2, and is exposed to outside by an opening TV2. The slit 181 is formed in a ring-like manner along an outer shape of the conductive layer MA22.

Thus, the shapes of the conductive layers MA21, MA22 configuring the external pad electrode $P_X$ are arbitrary, and the slit 181 too can be shaped in a ring shape of arbitrary shape, matching these shapes.

Modification of Second Embodiment

Figure 30:
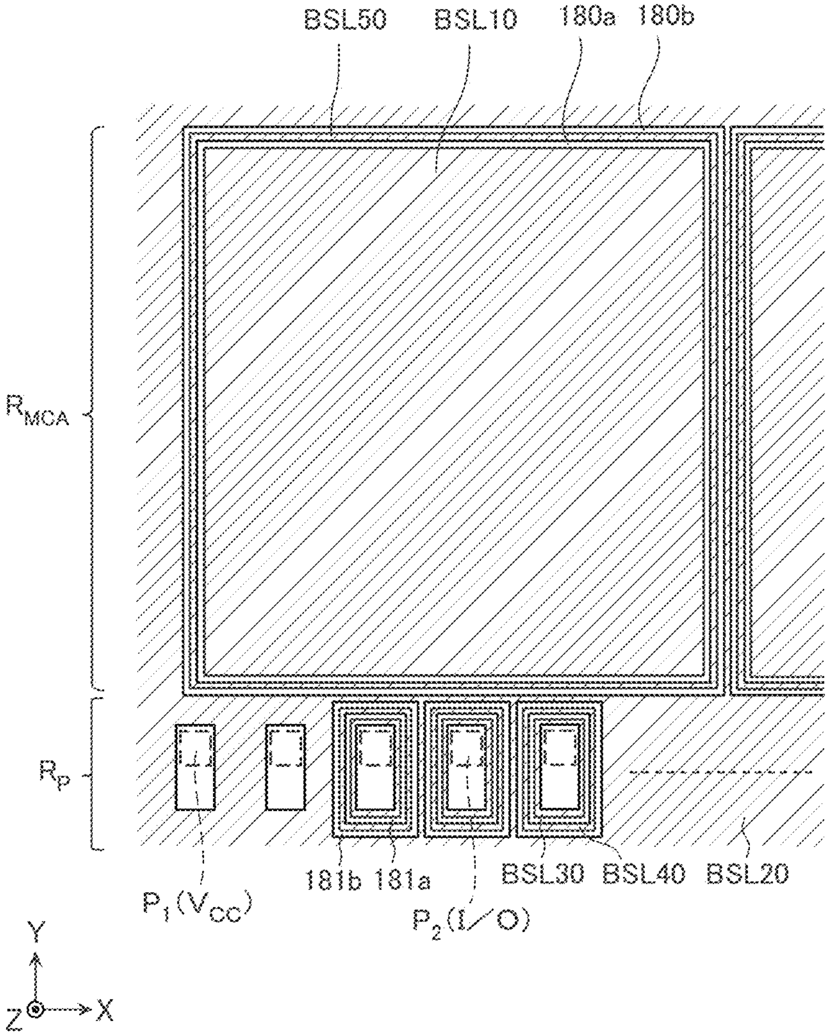
FIG. 30 is a schematic cross-sectional view showing a part of a configuration of a semiconductor memory device according to a modification of the second embodiment.

Next, a semiconductor memory device according to a modification of the second embodiment will be described with reference to FIG. 30. FIG. 30 is a view showing details of the external pad electrode $P_X$ of the signal terminals and power supply terminals of the semiconductor memory device according to the modification of the second embodiment, and is a schematic view enlarging part of FIG. 8. FIG. 30 shows a cross section in which the memory die MD has been cut along the XY plane at a position of the wiring layer $L_{BSL}$ in the Z-direction, and viewed from the Z-direction. Note that in the description below, description will sometimes be omitted for configurations similar to in the second embodiment.

In the present modification, two slits 180*a*, 180*b* are formed in a periphery of the memory plane MP, in addition to the two slits 181*a*, 181*b* formed in the periphery of the external pad electrode $P_2$(I/O) for signal terminals. As a result, a ring-shaped conductive layer BSL50 is formed between the conductive layer BSL10 corresponding to the memory plane MP and the conductive layer BSL20 in a periphery of the conductive layer BSL10. Hence, the conductive layer BSL10 and the conductive layer BSL20 in its periphery are certainly separated.

Modification 2 of First Embodiment

Figure 31:
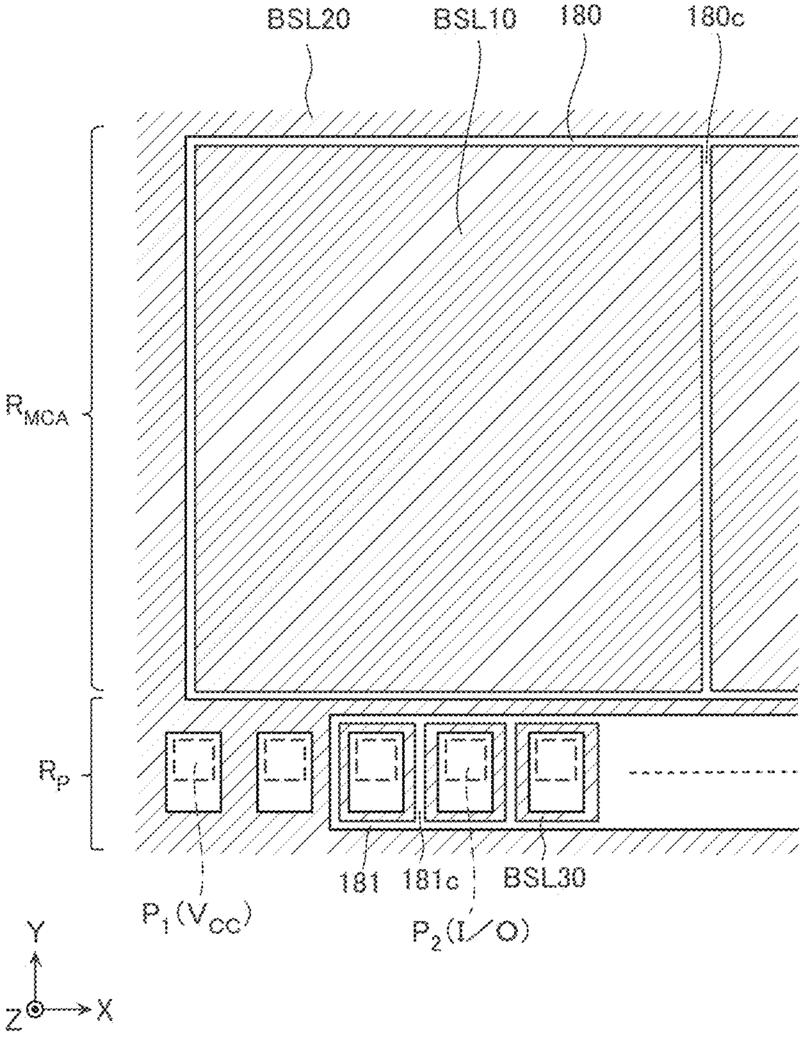
FIG. 31 is a schematic cross-sectional view showing a part of a configuration of a semiconductor memory device according to modification 2 of the first embodiment.

Next, a semiconductor memory device according to modification 2 of the first embodiment will be described with reference to FIG. 31. FIG. 31 is a view showing details of the external pad electrode $P_X$ of the signal terminals and power supply terminals of the semiconductor memory device according to modification 2 of the first embodiment, and is a schematic view enlarging part of FIG. 8. FIG. 31 shows a cross section in which the memory die MD has been cut along the XY plane at a position of the wiring layer $L_{BSL}$ in the Z-direction, and viewed from the Z-direction. Note that in the description below, description will sometimes be omitted for configurations similar to in the first embodiment.

In the present modification, there is shared use of a single slit 181*c* between external pad electrodes $P_2$(I/O) adjacent in the X-direction, of the slits 181 formed in the peripheries of the external pad electrodes $P_2$(I/O) for signal terminals. Moreover, there is also shared use of a single slit 180*c* between memory planes MP adjacent in the X-direction. As a result, an array pitch in the X-direction of the external pad electrodes $P_2$(I/O) for signal terminals and an array pitch in the X-direction of the memory planes MP, can be made smaller than in the first embodiment.

Fifth Embodiment

Figure 32:
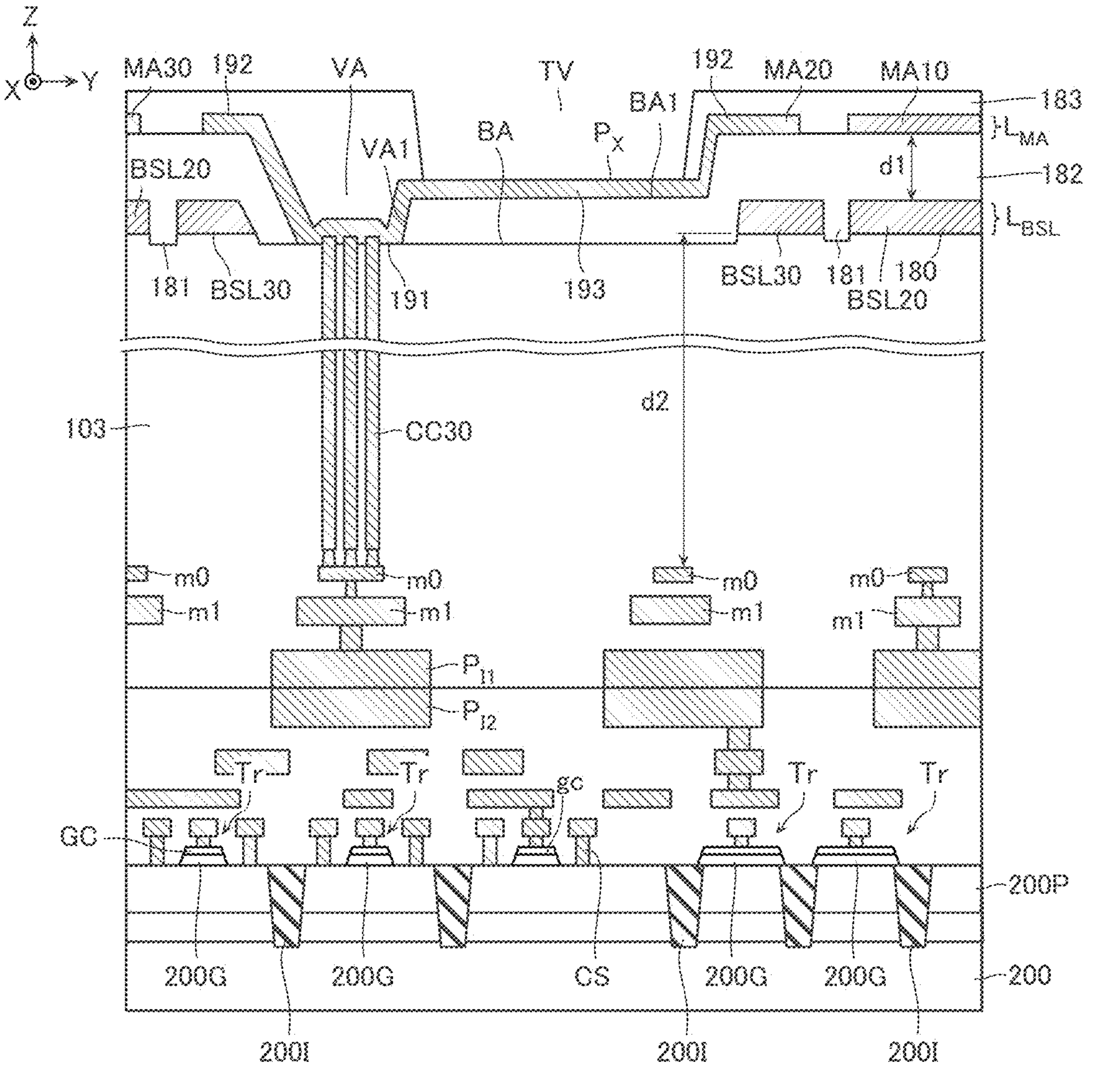
FIG. 32 is a schematic cross-sectional view showing a part of a configuration of a semiconductor device according to a fifth embodiment.

Next, a semiconductor device according to a fifth embodiment will be described with reference to FIG. 32. FIG. 32 is a cross-sectional view showing part of the semiconductor device according to the fifth embodiment, and shows a portion corresponding to FIG. 12. Note that in the description below, description will sometimes be omitted for configurations similar to in the first through fourth embodiments.

In the fifth embodiment, the periphery of the external pad electrode $P_X$ basically has a similar configuration to in the first embodiment. The first through fourth embodiments show examples applied to a semiconductor memory device. The fifth embodiment is not limited to the semiconductor memory device of the above-mentioned structure, and shows an example applied to a semiconductor device having another structure.

As shown in FIG. 32, a circuit provided on the semiconductor substrate 200, and the external pad electrode $P_X$ which is part of the wiring layer $L_{MA}$, are connected by the contact CC30 which extends in a stacking direction (the Z-direction). The wiring layer $L_{BSL}$ is provided between the semiconductor substrate 200 and the wiring layer $L_{MA}$. A wiring layer including a plurality of the wirings m0 is provided between the wiring layer $L_{BSL}$ and the semiconductor substrate 200. A distance d1 between the wiring layer $L_{MA}$ and the wiring layer $L_{BSL}$ is shorter than a distance d2 between the wiring layer $L_{BSL}$ and the wiring layer including a plurality of the wirings m0.

In the fifth embodiment too, the slit 181 is provided between the conductive layer BSL20 and the conductive layer BSL30 configuring the wiring layer $L_{BSL}$. Moreover, the ring-like conductive layer BSL30 is included between the slit 181 and the opening BA. The conductive layer BSL30 is separated from the conductive layer BSL20 on its outer side, is not connected to the plurality of wirings in the wiring layer $L_{MA}$, and is not connected to the wirings m0, and is isolated from its periphery to be in a floating state. Such a configuration enables high speed operation when the external pad electrode $P_X$ is used as the signal terminal.

Others

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
- a substrate;
- a first wiring layer;
- a second wiring layer provided between the substrate and the first wiring layer; and
- a memory cell array layer provided between the substrate and the second wiring layer, wherein
- the memory cell array layer comprises:
- a plurality of first conductive layers arranged in a first direction intersecting with a surface of the substrate;
- a semiconductor layer extending in the first direction and opposed to the plurality of first conductive layers;
- an electric charge accumulating layer provided between the plurality of first conductive layers and the semiconductor layer; and
- a contact extending in the first direction,
- the first wiring layer has a second conductive layer that includes a connecting portion, a pad electrode portion, and a peripheral edge portion,
- the connecting portion is connected to one end in the first direction of the contact, and
- the second wiring layer has: a first opening which is provided in a region including the connecting portion and the pad electrode portion of the second conductive layer;
- and a ring-shaped first slit which surrounds the peripheral edge portion of the second conductive layer.

2. The semiconductor memory device according to claim 1, wherein
- the pad electrode portion of the second conductive layer functions as an external pad electrode for a signal terminal used in input, output, or input/output of an address, a command, data, or a control signal.

3. The semiconductor memory device according to claim 1, wherein
- the second wiring layer includes a source line.

4. The semiconductor memory device according to claim 1, comprising
- a third wiring layer which is provided between the substrate and the memory cell array layer, wherein
- the other end in the first direction of the contact is connected to a wiring within the third wiring layer, and
- the third wiring layer includes a bit line.

5. The semiconductor memory device according to claim 1, wherein
- the second wiring layer further has a second slit in a periphery of the first slit.

6. The semiconductor memory device according to claim 1, wherein the second wiring layer has a ring-shaped third conductive layer between the first opening and the first slit.

7. The semiconductor memory device according to claim 5, wherein the second wiring layer has a ring-shaped third conductive layer between the first opening and the first slit, and has a ring-shaped fourth conductive layer between the first slit and the second slit.

8. The semiconductor memory device according to claim 1, wherein the second wiring layer has a plurality of third conductive layers which are disposed in a ring-like manner between the first opening and the first slit.

9. The semiconductor memory device according to claim 5, wherein the second wiring layer has a ring-shaped third conductive layer between the first opening and the first slit, and has a plurality of fourth conductive layers which are disposed in a ring-like manner between the first slit and the second slit.

10. The semiconductor memory device according to claim 6, comprising a third wiring layer which is provided between the substrate and the memory cell array layer, wherein the other end in the first direction of the contact is connected to a wiring within the third wiring layer, and the third conductive layer is not connected to a plurality of wirings within the third wiring layer.

11. The semiconductor memory device according to claim 6, wherein the third conductive layer is in a floating state.

12. The semiconductor memory device according to claim 1, wherein the first slit of the second wiring layer includes an air gap.

13. The semiconductor memory device according to claim 1, wherein a first insulating layer is provided on a top portion of the second wiring layer, and a width in a direction parallel to the substrate of the first slit of the second wiring layer is 0.1 to 0.5 times a film thickness of the first insulating layer.

14. The semiconductor memory device according to claim 1, wherein the first wiring layer has a fifth conductive layer that includes a connecting portion, a pad electrode portion, and a peripheral edge portion, and the fifth conductive layer functions as an external pad electrode for a power source terminal, and the second wiring layer has a second opening which is provided in a region including the connecting portion and the pad electrode portion of the fifth conductive layer.

15. The semiconductor memory device according to claim 14, wherein the second wiring layer is not provided with a ring-shaped slit surrounding the peripheral edge portion of the fifth conductive layer.

16. The semiconductor memory device according to claim 1, wherein a position in the first direction of the pad electrode portion of the second conductive layer is between the connecting portion and the peripheral edge portion.

17. A semiconductor device comprising:

a substrate;

a first wiring layer;

a second wiring layer provided between the substrate and the first wiring layer; and a contact extending in a first direction intersecting with a surface of the substrate, wherein the first wiring layer has a first conductive layer that includes a connecting portion, a pad electrode portion, and a peripheral edge portion, the connecting portion is connected to one end in the first direction of the contact, and the second wiring layer has: a first opening which is provided in a region including the connecting portion and the pad electrode portion of the first conductive layer; and a ring-shaped first slit which surrounds the peripheral edge portion of the first conductive layer.

18. The semiconductor device according to claim 17, comprising a third wiring layer which is provided between the substrate and the second wiring layer, wherein the other end in the first direction of the contact is connected to a wiring within the third wiring layer, and a distance in the first direction between the first wiring layer and the second wiring layer is shorter compared to a distance in the first direction between the second wiring layer and the third wiring layer.

19. The semiconductor device according to claim 17, comprising a third wiring layer which is provided between the substrate and the second wiring layer, wherein the other end in the first direction of the contact is connected to a wiring within the third wiring layer, the second wiring layer has a ring-shaped second conductive layer between the first opening and the first slit, and the second conductive layer is not connected to a plurality of wirings within the third wiring layer.

20. The semiconductor device according to claim 17, wherein the second wiring layer has a ring-shaped second conductive layer between the first opening and the first slit, and the second conductive layer is in a floating state.

* * * * *